United States Patent
Rieske et al.

(10) Patent No.: US 11,664,277 B2
(45) Date of Patent: May 30, 2023

(54) METHOD FOR THINNING SOLID-BODY LAYERS PROVIDED WITH COMPONENTS

(71) Applicant: Siltectra GmbH, Dresden (DE)

(72) Inventors: Ralf Rieske, Dresden (DE); Marko Swoboda, Dresden (DE); Jan Richter, Dresden (DE)

(73) Assignee: Siltectra GmbH, Dresden (DE)

( * ) Notice: Subject to any disclaimer, the term of this patent is extended or adjusted under 35 U.S.C. 154(b) by 37 days.

(21) Appl. No.: 16/762,070

(22) PCT Filed: Sep. 14, 2018

(86) PCT No.: PCT/EP2018/074893
§ 371 (c)(1),
(2) Date: May 6, 2020

(87) PCT Pub. No.: WO2019/091634
PCT Pub. Date: May 16, 2019

(65) Prior Publication Data
US 2021/0225709 A1 Jul. 22, 2021

(30) Foreign Application Priority Data
Nov. 7, 2017 (DE) .......................... 102017010284.8

(51) Int. Cl.
*H01L 21/78* (2006.01)
*B23K 26/53* (2014.01)
(Continued)

(52) U.S. Cl.
CPC .......... *H01L 21/7806* (2013.01); *B23K 26/53* (2015.10); *H01L 21/2855* (2013.01);
(Continued)

(58) Field of Classification Search
CPC . B23K 26/53; H01L 21/7806; H01L 21/2855; H01L 21/4878; H01L 29/1608;
(Continued)

(56) References Cited

U.S. PATENT DOCUMENTS

| | | | |
|---|---|---|---|
| 2009/0242010 A1 | 10/2009 | Herner | |
| 2012/0196414 A1* | 8/2012 | Ngai | H01L 21/6835 |
| | | | 257/E21.403 |

(Continued)

FOREIGN PATENT DOCUMENTS

| | | |
|---|---|---|
| CN | 105899325 A | 8/2016 |
| CN | 105899716 A | 8/2016 |

(Continued)

OTHER PUBLICATIONS

Saha, Sayan, et al., "Single heterojunction solar cells on exfoliated flexible ~25 μm thick mono-crystalline silicon substrates", Applied Physics Letters, vol. 102, 2013, pp. 163904.1-163904.5.

*Primary Examiner* — Alia Sabur
(74) *Attorney, Agent, or Firm* — Murphy, Bilak & Homiller, PLLC

(57) ABSTRACT

According to claim 1, the invention relates to a method for providing at least one solid-body layer (4). The solid-body layer (4) is separated from a solid body (1). The method according to the invention preferably has the steps of: producing a plurality of modifications (9) in the interior of the solid body (1) using laser beams in order to form a separation plane (8), compressive stresses being produced in the solid body (1) by the modifications (9); separating the solid-body layer (4) by separating the remaining solid body (1) and the solid-body layer (4) along the separation plane (8) formed by the modifications (9), wherein at least parts of the modifications (9) which produce the compressive stresses remain on the solid-body layer (4), and enough modifications (9) are produced that the solid-body layer (4)

(Continued)

is separated from the solid body (1) on the basis of the modifications (9) or an external force is introduced into the solid body (1) in order to produce additional stresses in the solid body (1), said external force being so great that the stresses cause a crack to propagate along the separation plane (8) produced by the modifications; and producing a metal layer on the surface exposed by the separation of the solid-body layer (4) from the solid body (1) in order to at least partly, preferably greatly and particularly preferably completely, compensate for a deformation of the solid-body layer (4) produced by the compressive stresses of the remaining modification parts or at feast partly, preferably greatly or completely, compensate for the compressive stresses.

19 Claims, 9 Drawing Sheets

(51) Int. Cl.
    *H01L 21/285* (2006.01)
    *H01L 21/48* (2006.01)
    *H01L 29/16* (2006.01)
    *B23K 101/40* (2006.01)

(52) U.S. Cl.
    CPC ...... *H01L 21/4878* (2013.01); *H01L 29/1608* (2013.01); *B23K 2101/40* (2018.08)

(58) Field of Classification Search
    CPC ....... H01L 2924/2511; H01L 21/76254; B28D 5/0011
    See application file for complete search history.

(56) References Cited

U.S. PATENT DOCUMENTS

| | | | |
|---|---|---|---|
| 2014/0038392 A1 | 2/2014 | Yonehara et al. | |
| 2015/0349191 A1 | 12/2015 | Moriceau et al. | |
| 2016/0064283 A1 | 3/2016 | Lichtensteiger et al. | |
| 2016/0204088 A1* | 7/2016 | Fong | H01L 25/105 438/107 |
| 2018/0001416 A1* | 1/2018 | Richter | H01L 21/02002 |
| 2018/0138357 A1* | 5/2018 | Henley | H01L 33/0075 |
| 2019/0071552 A1 | 3/2019 | Beyer et al. | |

FOREIGN PATENT DOCUMENTS

| | | | | |
|---|---|---|---|---|
| CN | 107206544 A | 9/2017 | | |
| DE | 102012001620 A1 | 8/2013 | | |
| DE | 102013007672 A1 | 11/2014 | | |
| DE | 102013016682 A1 * | 4/2015 | ............ | B23K 26/40 |
| DE | 102013016682 A1 | 4/2015 | | |
| DE | 102014018841 A1 * | 6/2016 | ............ | B23K 26/53 |
| DE | 102015000451 A1 * | 7/2016 | ........ | B23K 26/0624 |
| JP | 2015516672 A | 6/2015 | | |
| JP | 2016046309 A | 4/2016 | | |
| WO | 2010072675 A2 | 7/2010 | | |
| WO | 2014177721 A1 | 11/2014 | | |
| WO | 2015052218 A1 | 4/2015 | | |
| WO | 2016083610 A2 | 6/2016 | | |
| WO | 2017167614 A1 | 10/2017 | | |

* cited by examiner

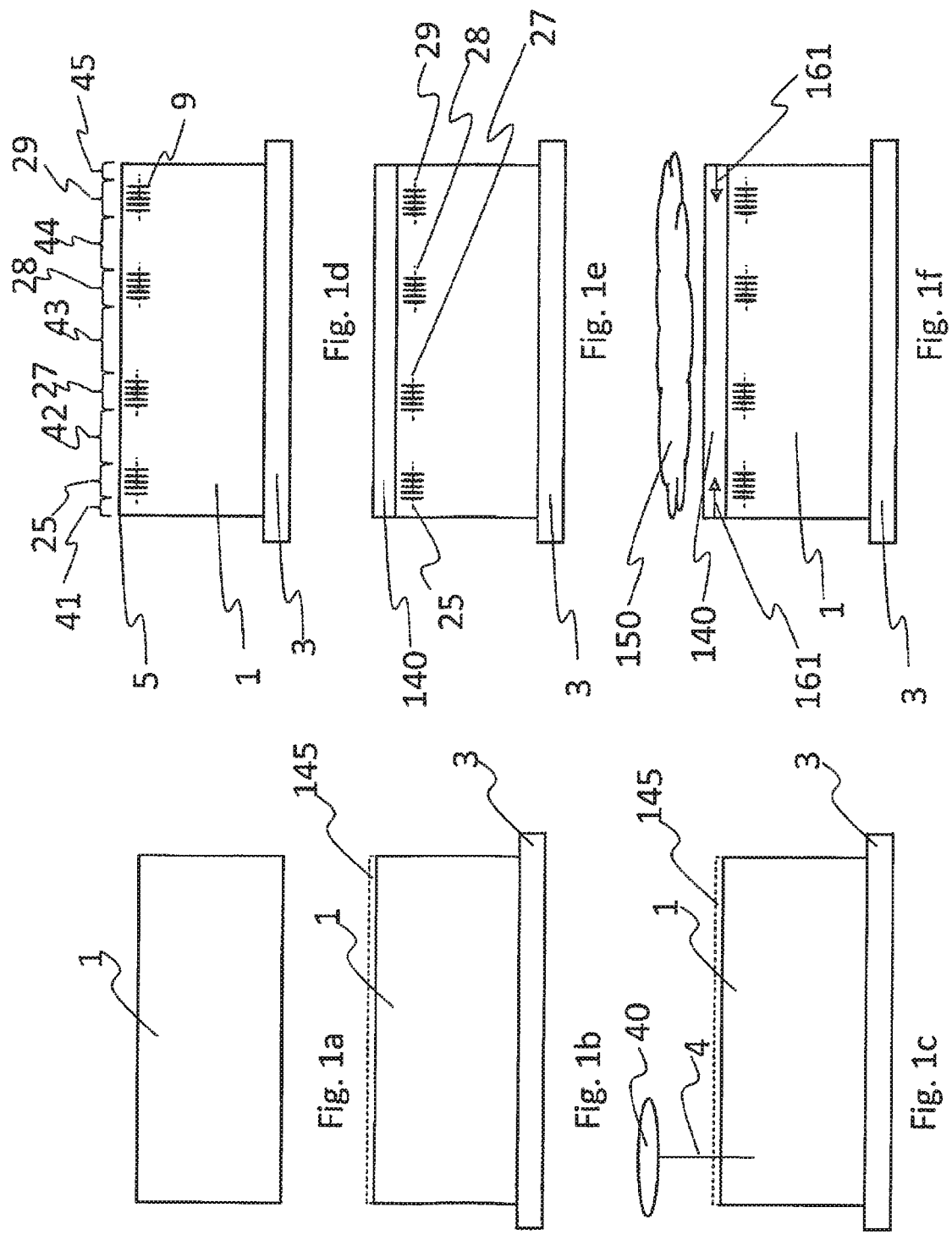

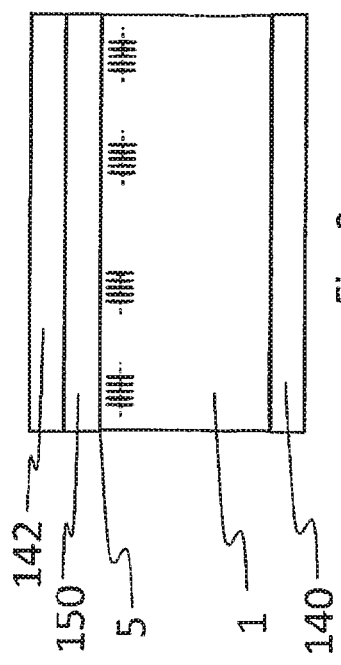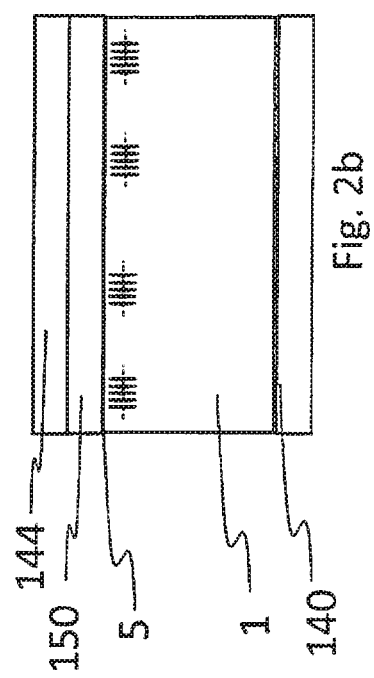

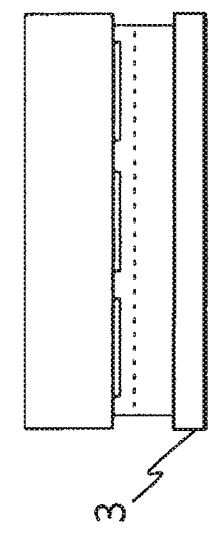
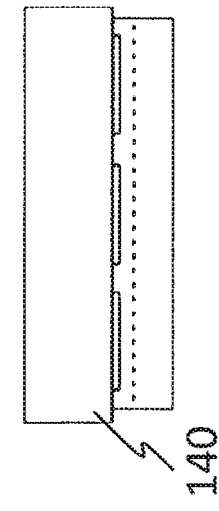
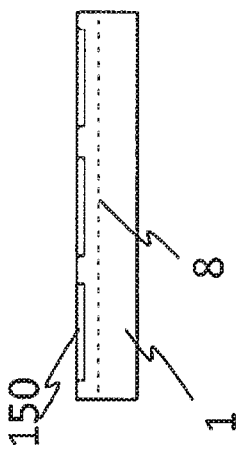
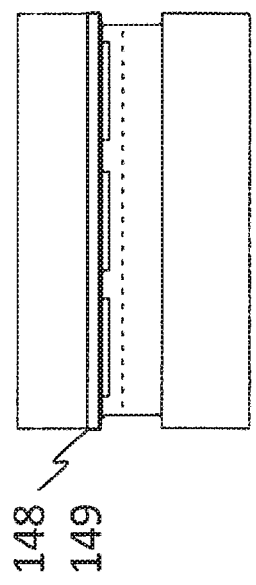
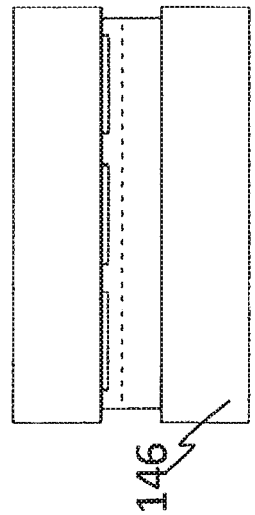
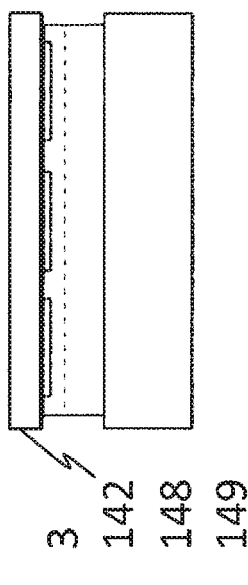
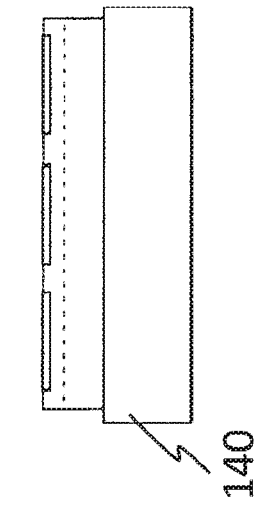
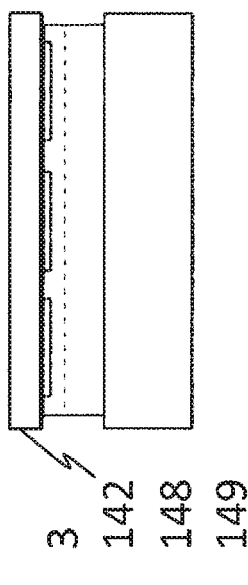
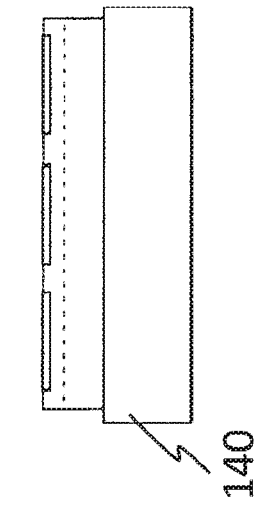
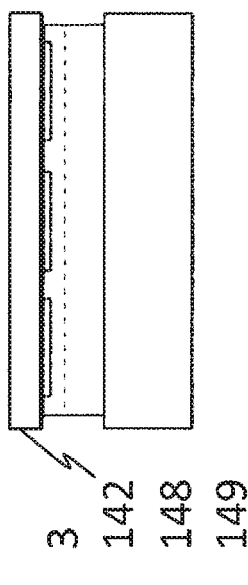

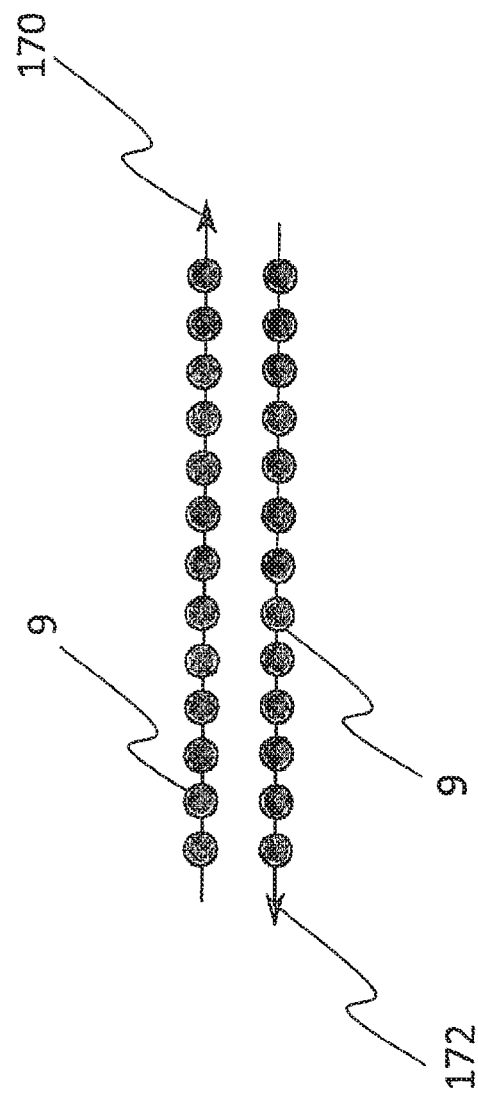

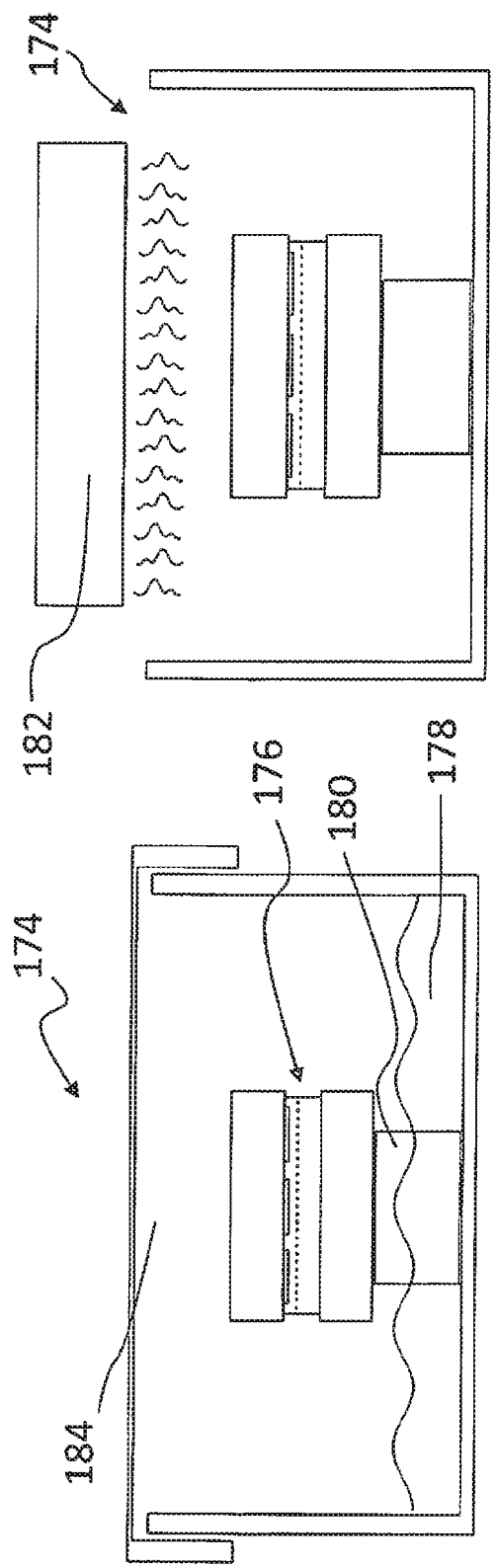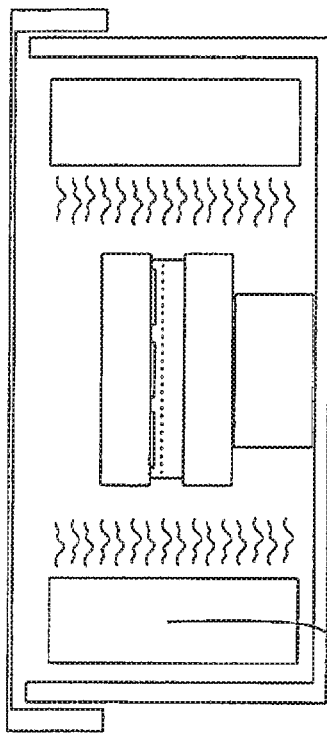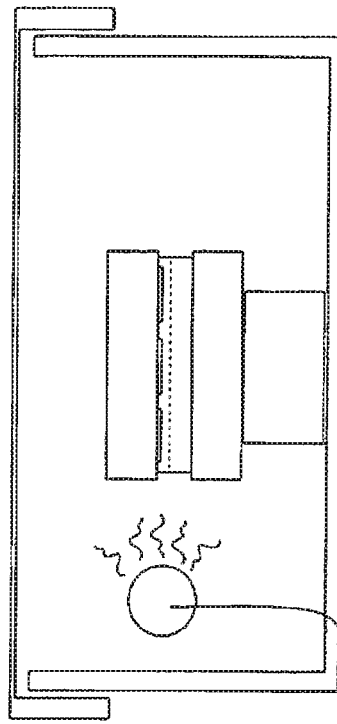

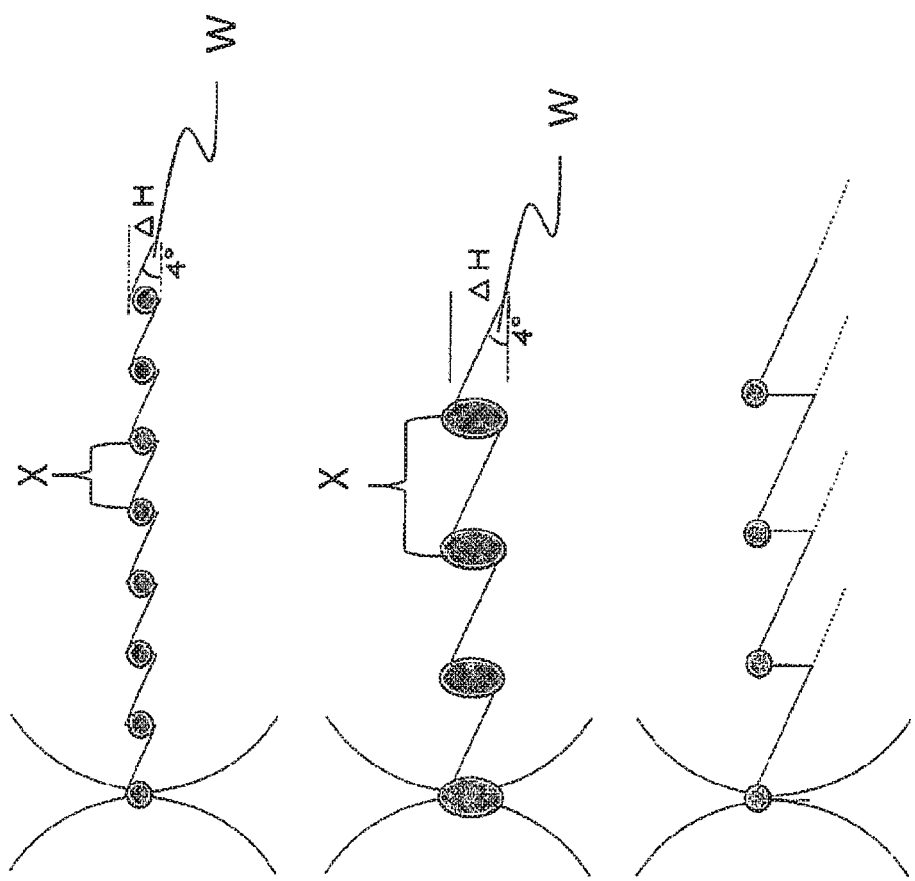

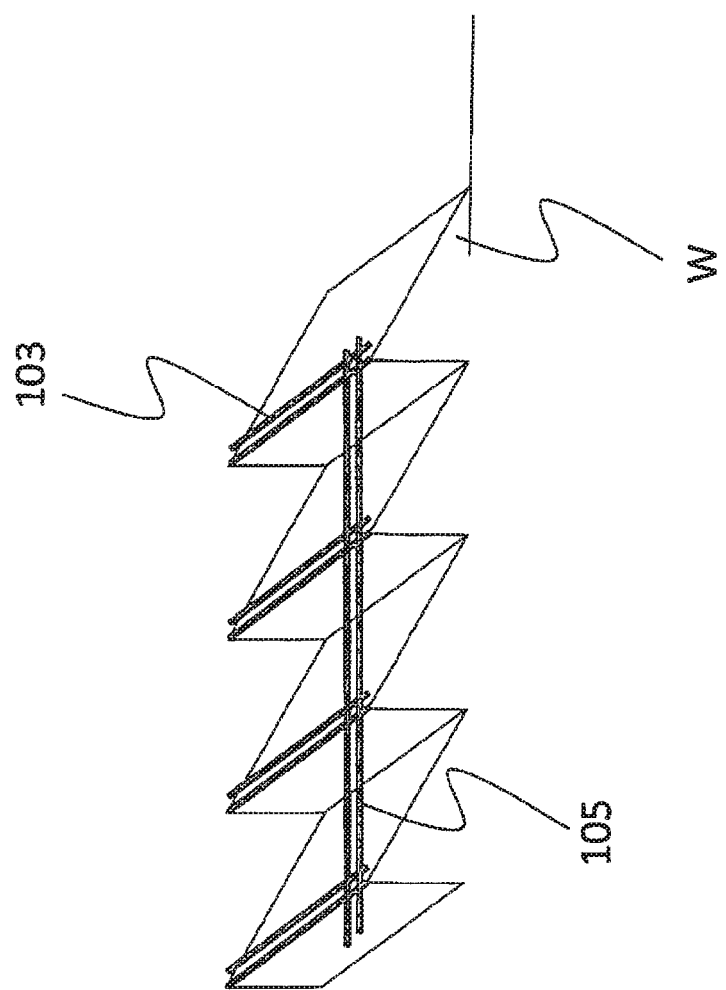

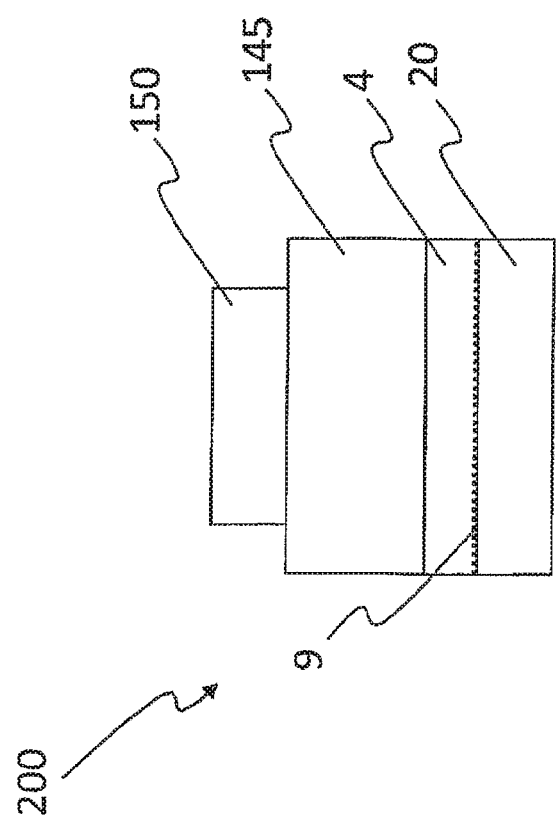

METHOD FOR THINNING SOLID-BODY LAYERS PROVIDED WITH COMPONENTS

The present invention relates, according to claim 1, to a method of separating at least one solid-state layer from at least one solid-state body or to a for providing at least one solid-state layer method of providing at least one solid-state layer and, according to claim 2, to methods of producing electrical components and, according to claim 15, to a multicomponent arrangement.

A number of components in the semiconductor industry are required on thinned solid-state layers or substrates. However, since thin substrates are difficult to handle in the customary processes and even wafers can be produced only down to a specific thickness by conventional wire sawing processes, the most common form of production of such components on thin substrates is the grinding-away or backside thinning of the substrate on completion of processing.

In this case, a conventional wafer is processed to completion before, in a grinding and polishing step at the end, the final desired substrate thickness is established by removing the excess material. This circumstance is disadvantageous for two reasons: firstly, valuable material is partly lost in the grinding step; secondly, the grinding/polishing step harbors the potential through damage to the substrate the potential for total loss of the components already processed that already contain a major part of the value created in the wafer.

A further method of thinning solid-state bodies is disclosed by publication WO2014/177721A1 By this method, a polymer layer is mounted on a solid state body. A heat treatment of the polymer layer then generates stresses in the solid-state body, by means of which a solid-state layer is separated from the remaining solid-state body.

Publication DE 10 2012 001 620 A1 describes the use of an additional sacrificial layer between solid-state body and polymer film that serves for improved removal of the polymer film after the splitting-off step, in that the sacrificial layer is decomposed or detached, for example by chemical means by addition of suitable reactants. However, a disadvantage of this process is the long period of time, which can be up several hours, that passes before the polymer layer is completely removed. This significantly limits industrial utilization. To accelerate the process of polymer removal, it is possible by an appropriate pretreatment to introduce additional driving forces in the form of suitable tensile stresses that are effective even at room temperature. These lead to an increase in the size of the area of attack for the reactants or the solvent and promote breakdown or detachment and dissolution.

In addition, WO 2010/072675 A2 discloses providing fillers in the polymer in order to be able to locally influence the coefficients of thermal expansion or the modulus of elasticity. However, it has been found that such fillers often worsen the adhesion of the polymer on the surface of the solid-state body to be divided, such that sufficient transmission of force is no longer possible.

It is thus an object of the present invention to improve the thinning of the semiconductor substrates, especially in that material is conserved and the wafer losses (called "yield loss") are reduced and/or to provide a means of more advantageous production of electrical components and/or to provide advantageous multicomponent arrangements.

The aforementioned object is achieved according to claim 1 by a method of providing at least one solid-state layer, wherein the solid-state layer is separated from a solid-state body. The process of the invention preferably comprises at least the following steps: generating a variety of modifications by means of laser beams within the solid-state body to form a detachment plane, wherein the modifications generate compressive stresses in the solid-state body, removing the solid-state layer by a separation of the remaining solid-state body and the solid-state layer along the detachment plane formed by the modifications, wherein at least constituents of the modifications that generate the compressive stresses remain on the solid-state layer, wherein a sufficient number of modifications are generated that the solid-state layer becomes detached from the solid-state body owing to the modifications or wherein an external force is introduced into the solid-state body to generate further stresses in the solid-state body, wherein the external force is sufficiently high that the stresses bring about crack propagation along the detachment plane formed by the modifications, generating a material layer, especially a metal layer, on the surface exposed by the removal of the solid-state layer from the solid-state body for at least partial and preferably substantial and more preferably complete compensation of a deformation of the solid-state layer brought about by the compressive stresses on the remaining modification constituents or for at least partial and preferably substantial or complete compensation of the compressive stresses.

This solution is advantageous since very planar solid-state layers may be provided without any need for material-removing processing of the solid-state layer. This is advisable especially in the case of the solid-state material SiC since production thereof is very costly and therefore material losses should be avoided as far as possible. Moreover, SiC is very hard, which means that it is necessary to use very costly grinding tools that wear very quickly owing to the high hardness of SiC. This solution is also advisable since the solid-state layers provided are already equipped with a material layer, especially a metal layer, to establish an electrical contact and/or to form an interface for heat removal.

The problem stated above is also achieved according to claim 2 by a method of generating electrical components. This method of the invention preferably comprises at least the steps of: generating a multitude of modifications by means of laser beams within a solid-state body to form a detachment plane, wherein the modifications generate compressive stresses in the solid-state body, generating a composite structure by arrangement or generation of layers and/or components atop or above an initially exposed surface of the solid-state body, wherein the exposed surface is part of the solid-state layer to be removed, removing the solid-state layer by a separation of the remaining solid-state body and the solid-state layer along the detachment plane formed by the modifications, wherein at least constituents of the modifications that generate the compressive stresses remain on the solid-state layer, wherein a sufficient number of modifications are generated that the solid-state layer becomes detached from the solid-state body owing to the modifications or wherein an external force is introduced into the solid-state body to generate further stresses in the solid-state body, wherein the external force is sufficiently high that the stresses bring about crack propagation along the detachment plane formed by the modifications, in the solid-state layer removed, there are preferably compressive stresses for deformation of the solid-state layer, wherein the compressive stresses are generated by the constituents of the modifications that remain in the solid-state layer, and the step of generating a material layer, especially a metal layer, on the surface exposed by the removal of the solid-state layer from the solid-state body for at least partial compensation of a deformation of the solid-state layer brought about by the compressive stresses on the remaining modification constituents or for compensation of the compressive stresses generated by the modification constituents.

In a preferred embodiment of the present invention, the surface of the solid-state layer exposed as a result of the removal has first surface components having an Ra value (average roughness) of less than 1, especially of less than 0.9 or of less than 0.7 or of less than 0.5, especially between 0.01 and 0.4. In addition, the exposed surface of the solid-state layer preferably has second surface components having an Ra value (average roughness) of more than 1, especially between 1 and 5. The proportion of the first surface components here is preferably greater than the proportion of the second surface components, where the second surface components form at least 1% or at least 2% or at least 5% or at least 10% or between 1% and 49% or between 1% and 40% or between 1% and 30% or between 1% and 20% of the total area formed from the first surface components and the second surface components. This solution is advantageous since the solid-state layer itself is further processible especially without further surface conditioning, for example grinding or lapping, with proportions having Ra values between 1 and 5.

In a further preferred embodiment of the present invention, the material layer, especially metal layer, is generated in a first state of matter and at a temperature above room temperature on the solid-state layer and is in a second state of matter at room temperature, wherein the metal layer, by virtue of the transition from the first state of matter to the second state of matter, subjects the solid-state layer to the at least partial compensation and preferably complete compensation of the deformation or compressive stresses brought about by the compressive stresses from the remaining modification constituents. Alternatively, the metal layer may be generated within a temperature range above room temperature on the solid-state layer, where the temperature range is at least 100° C. or 150° C. or 200° C. or 250° C. or 300° C. or 350° C. or 400° C. above room temperature and more preferably up to a maximum of 2000° C. or less than the melting or evaporation temperature of the solid-state material, wherein the cooling of the metal layer to room temperature subjects the solid-state layer to at least partial compensation and preferably complete compensation of the deformation brought about by the compressive stresses from the remaining modification constituents and to compensation for the compressive stresses. The cooling and/or solidification of the metal layer thus gives rise to forces, especially tensile forces, by which the solid-state layer is preferably negatively deformed with respect to the deformation brought about by the compressive stresses or by which the compressive stresses are compensated. The compressive stresses preferably bring about a deformation referred to as bow. Room temperature is preferably defined here as 20° C., where room temperature may also describe the temperature in a process space that may preferably be between 0° C. and 100° C. or between 20° C. and 200° C.

In a further preferred embodiment of the present invention, the metal layer is generated by sputtering or electrochemical deposition. Preference is given to using, for example, in the case of a solid-state SiC layer having modification constituents, known sputtering materials or materials usable for electrochemical deposition, for example titanium, titanium-tungsten, nickel, platinum, $TaSi_2$ and/or gold. The thickness of the metal layer is preferably determined here by the parameters of thickness of the solid-state layer, material of the solid-state layer, area of the solid-state layer, number and type of modifications.

In a further preferred embodiment of the present invention, the solid-state body consists of silicon carbide (SiC) or includes silicon carbide (SIC), where the solid-state layer is preferably separated from the solid-state body with a thickness of less than 200 µm, especially with a thickness of less than 150 µm or of less than 125 µm or of less than 110 µm or of less than 100 µm or of less than 90 µm or of less than 75 µm. This solution is advantageous since SiC has very good controllability by means of the method proposed here and hence electrical components are producible with distinctly lower material loss and with distinctly lower wear on the treatment devices.

In a further preferred embodiment of the present invention, the electrical components are vertical components, especially Schottky diodes and/or metal oxide semiconductor field-effect transistors (MOSFETs), wherein the metal layer forms an electrical contact, especially an ohmic contact, and/or forms an interface for heat removal. This embodiment is advantageous since vertical components can be generated by the present invention with comparatively low material and wear losses in very planar form (for example through the use of SiC) and hence more easily as well. This creates the possibility of generating electrical components in a distinctly more energy-efficient and inexpensive manner.

In a further preferred embodiment of the present invention, the electrical components are horizontal components, especially high-electron-mobility transistors (HEMTs), wherein the metal layer preferably forms an interface for heat removal. This embodiment is advantageous since these components can be produced in a smaller size and lower weight and more favorably.

In a further preferred embodiment of the present invention, a multitude of electrical components, especially at least 4 or at least 9 or at least 36 or at least 100, are generated on average per cm2 of a planar surface side of the solid-state layer, where the electrical components, after they have been produced, are separated from one another by means of dicing. This embodiment is advantageous since the individual electrical components are separable from one another quickly and very gently. Preferably, the individual electrical components have rectangular, especially square, footprints. The electrical components preferably have outer edges between 0.1 mm and 5 mm.

It is thus preferable that, especially prior to processing of the components, a laser modification layer is produced in the solid-state body or substrate that defines the later thinning plane or detachment plane. More preferably, the further processes for forming or generating layers and/or for component production (lithography, etc.) take place only thereafter.

The layers and/or components that form the composite structure together with the solid-state layer are preferably brought about by means of lithography, especially coating with, for example, metal compounds, lacquering, optical exposure (e.g. scanning through a photomask), development of the photoresist (especially at low temperatures, such as temperatures below 70° C., especially below 50° C. or below 30° C. or below ambient temperature or below 20° C. or below 5° C. or below 0° C.), etching structures. To generate a circuit, especially a finished circuit, individual or multiple or all of these processes, especially lithography processes, may be repeated multiple times, especially more than 10 times or up to 10 times or more than 20 times or up to 20 times or more than 40 times or up to 40 times or more than 80 times or up to 80 times.

The solid-state body that remains after the removal of the solid-state layer preferably has a thickness greater than, especially several times greater than, the thickness of the solid-state layer removed. The solid-state material is preferably a semiconductor material or includes a semiconductor material.

It should be understood here that "atop or above" a surface of the solid-state layer to be removed may also be understood to mean that, in the case of a high-temperature step preceding the laser treatment for generation of the modifications, the surface generated by the high-temperature method may be coated, on which the further layer(s) and/or components for generating the composite structure may then be arranged or generated. By definition, the composite structure is generated only after the laser treatment; any multilayer arrangement present prior to the laser treatment is not called a composite structure in the context of this patent application; but a multilayer arrangement.

Thinning here means the reduction in the thickness of the solid-state body, which is preferably a wafer, by the material content that would be abrasively removed, i.e., for example, machined away, ground or polished away, in conventional production processes of solid-state bodies provided with components, especially wafers.

Further preferred embodiments are the subject of the dependent claims and of the parts of the description cited below.

In a preferred embodiment of the present invention, the external force is introduced by arrangement of an absorbing layer on an exposed surface of the composite structure, wherein the absorbing layer includes a polymer material and the absorbing layer is subjected to thermal stress for generation, especially mechanical generation, of stresses in the solid-state body, wherein the exposure to thermal stress involves cooling the absorbing layer to a temperature below the ambient temperature, wherein the cooling is effected by subjecting the polymer material in the absorbing layer to partial or complete crystallization and/or a glass transition, and wherein the stresses result in propagation of a crack in the solid-state body along the detachment plane that separates the first solid-state layer from the solid-state body, or the external force is introduced into the solid-state body by exposing the solid-state body to ultrasound, with the solid-state body preferably disposed here in a liquid-filled vessel. The ultrasound may be used with a frequency range from 20 kHz to 100 kHz, but also in the high-frequency sound range with a frequency range from 100 kHz to 1 MHz. On account of these frequencies, there are preferably cavitation processes resulting in phenomena such as collapsing cavitation bubbles, for example, in solid-state bodies in liquid media. In liquid media, particularly in the region of phase boundaries, there is implosion and deformation of dynamically forming cavitation bubbles and formation of a microjet within the nanosecond range. The spatially resolved release of energy is accomplished in the form of adiabatic heating in a very small space by virtue of the very rapid compression of the gas. There is occurrence here of extreme temperatures of up to 5000 Kelvin and pressures up to 500 bar, which enable new physical reactions in the region of the interface layer that do not otherwise take place. These enormous pressure differences result from the rebound of the bubble front outward (imploding shockwave). This results in significantly increased reaction rates in this region. According to the invention, particular preference is given to a spatially resolved CNC-controlled exposure with the aid of an ultrasound tip (sonotrode) which can bring about a controlled influence on the triggering of cracks and/or progression of cracks. The spatially resolved compressive stress can be utilized in a controlled manner for triggering cracks and/or progressing cracks.

The homogeneous and/or spatially resolved embodiment is advantageous since, especially in the case of use of the absorbing layer, very precise introduction of force and hence triggering of cracks and/or progression of cracks can be brought about.

In a further preferred embodiment of the present invention, prior to the generation of the detachment plane, the solid-state body is treated by at least one high-temperature method, wherein the high-temperature method is performed with a temperature between 70° C. and the melting temperature or evaporation temperature of the material of the solid-state body.

Thus, the performance of the laser step on a partly processed wafer constitutes a further option; more preferably in accordance with the invention, this is performed after the high-temperature steps, but before the other processes. This solution is advantageous since not all structures that can be damaged by the laser method have formed yet.

It is possible here to optimize parameters of the laser method in such a way that stress in the solid-state body is minimized as much as possible, for example by gentle multiple exposure of the solid-state body, by greater line separations and decreasing energies in every pass.

The laser process is preferably performed depending on the crystallographic orientation of the substrate, i.e. the laser modification is more preferably conducted as much as possible in such a way that microcracks formed in the course of treatment neither hinder lithography nor run out of the modification plane in a supercritical manner and can lead to loss of substrate after the triggering of the removal crack. It is possible here, for example, to conduct first lines parallel to the preferred cracking direction in SiC, in order to define a cracking plane, before lines at a 90° angle thereto in a second step finally trigger the cracks and define the separation plane.

The performance of the high-temperature steps prior to the generation of the detachment plane is highly advantageous since a distinct increase in the temperature above 70° C. is associated with elevated mobility of dopant atoms, atoms of metallic contaminants and dislocations or other crystal structure defects. If the detachment plane had been generated or partly generated prior to the high-temperature step, it would then have been possible, for example, for microcracks that had formed to extend or grow further into the solid-state body or into the solid-state layer to be removed, which would mean that more material would have to be removed and hence greater losses would occur.

In a further preferred embodiment of the present invention, the at least one high-temperature method is an epitaxial method, a doping method or a method in which plasma is used. High-temperature methods are understood to mean all methods, especially material-removing methods, that are executed at a temperature above 70° C. The temperature that occurs is preferably less than 2000° C. or less than the melting temperature or evaporation temperature of the solid-state material. The high-temperature method preferably creates a multilayer arrangement of solid-state material and the one or at least one layer generated or disposed.

In a further preferred embodiment of the present invention, the high-temperature method generates at least one layer on the solid-state body, wherein the at least one layer generated has predefined parameters, wherein at least one predefined parameter defines a maximum degree of refraction and/or absorption and/or reflection and/or charge carrier generation via the photoeffect of laser light waves, wherein the degree of refraction and/or absorption and/or reflection and/or charge carrier generation via the photoeffect is below 5% and preferably below 1% and more preferably below 0.1%. This embodiment is advantageous since interactions of all metallic elements in the circuit with laser light are suppressed. Owing to interactions between a metal layer or metallic components and laser light or laser radiation, the metal layer and/or the components, especially electrical line connections, can be damaged.

Moreover, this embodiment solves the further problem that, on introduction of the laser plane, when metallic structures or components (for example longitudinal extent or extent in laser penetration direction of greater than 20 nm) have already been disposed or generated on the substrate, where the laser process is disrupted either by back-reflections on the structures or by the structures themselves, since, for example, transmission is not ideal. Since a multiphoton process is preferably utilized for generation of the material modifications, the focus in the material must preferably be very accurate, especially ideal, in order to enable the required high intensities with simultaneously minimum disruption of wavefronts. Thus, this advantage also supports a laser treatment prior to the processing or generation of the final structures, especially layers and/or components.

In a further preferred embodiment of the present invention, the modifications are preferably generated by means of a multiphoton excitation, especially a two-photon excitation.

Preferably, a multitude of base modifications is first generated on a line, especially a curved line, that runs homogeneously at least in sections, especially in the section that runs homogeneously. These base modifications are preferably generated with or depending on predefined process parameters. The predefined process parameters preferably include at least the pulse duration, pulse energy, pulse interval within a line, interval between the lines, depth and/or numerical aperture. Preferably, at least one value from these process parameters and preferably multiple values or all values from these process parameters or more than two values from these process parameters are fixed depending on the crystal lattice stability of the solid-state body. The value is more preferably chosen such that the crystal lattice around the respective base modifications remains intact, i.e. tears preferably to an extent of less than 20 μm or less than 10 μm or less than 5 μm or less than 1 μm.

In a further preferred embodiment of the present invention, trigger modifications for triggering subcritical cracks are generated, wherein at least one process parameter for generating the trigger modifications is different from at least one process parameter for generating the base modifications; preferably multiple process parameters are different. Additionally or alternatively, the trigger modifications may be generated in a direction inclined or spaced apart relative to the direction in which the line along which the base modifications are generated runs, where the subcritical cracks preferably propagate by less than 5 mm, especially less than 4 mm or less than 3 mm or less than 2 mm or less than 1 mm or less than 0.5 mm. An inclined alignment may correspond here, for example, to an angle between 0° and 90°, preferably an angle between 85° and 90° and more preferably an angle of 90°.

This is a threshold process which is triggered when a critical intensity (i.e. power/area) is exceeded. This means that short pulses need less energy/pulse; higher numerical aperture concentrates the energy to a smaller dot, i.e. also needs less energy to attain the threshold intensity.

A greater depth usually means absorption losses, which is why the energy has to be adjusted again accordingly, example of SiC: NA=0.4, depth 180 μm, pulse length 3 ns, pulse energy about 7 μJ, at depth 350 μm more like 9 μJ.

In general, harder materials (sapphire, aluminum oxide ceramic, SiC, GaN) need greater pulse overlap in the lines, i.e. smaller pulse separations (<=1 μm); on the other hand, the line spacings chosen tend to be greater (e.g. >5 μm), whereas softer materials such as GaAs and Si tend to require greater pulse separations (>1 μm) and, on the other hand, smaller line spacings (<5 μm).

Example pattern of SiC—with fs pulses: pulse energy about 800 nJ, pulse separation 50 nm or greater, up to 200 nm, line pattern as follows: 30 lines separated by 1 μm, then 20 μm gap, then 30 lines again, then 96 μm gap and then the same again, crossed with 30 lines, 20 μm gap and 30 lines (always with separation 1 μm between the lines), then 300 μm gap and then again 30/20/30 line block. Depth 180 μm, degree of doping of SiC (characterized by sheet resistance >21 mohm cm), pulse length 400 fs, numerical aperture 0.65.

In a preferred embodiment, the solid-state material is silicon, where the numerical aperture is between 0.5 and 0.8, especially 0.65, the penetration depth is between 150 μm and 1500 μm, especially 300 μm, the pulse separation is between 1 μm and 5 μm, especially 2 μm, the line spacing is between 1 μm and 5 μm, especially 2 μm, the pulse duration is between 50 ns and 400 ns, especially 300 ns, and the pulse energy is between 3 μJ and 30 μJ, especially 10 μJ.

In a preferred embodiment, the solid-state material is SiC, where the numerical aperture is between 0.4 and 0.8, especially 0.4, the penetration depth is between 50 μm and 500 μm, especially 180 μm, the pulse separation is between 0.1 μm and 3 μm, especially 1 μm, the line spacing is between 10 μm and 100 μm, especially 75 μm, the pulse duration is between 100 fs and 10 ns, especially 3 ns, and the pulse energy is between 0.5 μJ and 30 μJ, especially 7 μJ.

Example pattern of aluminum oxide ceramic: pulse separation 500 nm, line spacing 10 μm, pulse duration 3 ns, pulse energy 22 μJ, NA=0.4

Example pattern of sapphire: lines written in triplicate at 0°, 45°, 90°, each with line spacing 1.5 μm, pulse separation 300 nm, pulse energy in the first pass 350 nJ, in the second pass 300 nJ and in the third pass 250 nJ, at an NA of 0.65 and a pulse duration of 250 fs.

In general, the surface roughness decreases with shorter pulses; with femtosecond pulses it is possible to generate better surfaces (roughnesses less than 3 μm) than with nanosecond pulses (likely to above 3 μm), but the process is costlier and takes longer. Picosecond pulses constitute a middle way. The advantage in the case of shorter pulses is that the phase transition is athermal, i.e. there is coupling between laser pulse and crystal lattice, and hence fewer vibrations (phonons) are induced—the process thus runs colder overall. For that purpose, larger regions have to be amorphized (phase transformation) in order that the critical tension that triggers the cracks is built up.

In a further preferred embodiment of the present invention, the subcritical cracks propagate in the solid-state body for between 5 μm and 200 μm, especially between 10 μm and 100 μm or between 10 μm and 50 μm or between 10 μm and 30 μm or between 20 μm and 100 μm or between 20 μm and 50 μm or between 20 μm and 30 μm. This embodiment is advantageous since a smaller extent of crack propagation entails a smaller degree of reprocessing expenditure. The subcritical cracks propagate along the crystal lattice boundaries, but since the crystal lattice of the solid-state body is preferably inclined with respect to the detachment plane, especially at an angle between 0° and 6°, the result is a surface with a sawtooth profile. The further the cracks run, the greater the distance between the valleys and peaks of this surface in sawtooth form, which means that more material also has to be removed if a surface roughness of less than 80 nm or of less than 50 nm or between 20 nm and 50 nm is to be generated. In a further embodiment of the present invention, the crack propagation of the subcritical cracks thus runs in an inclined direction other than an angle of 90° relative to the direction of incidence of the laser beams; in particular the direction of crack propagation is preferably at an inclination of between 93° and 95°, especially exactly 94°, relative to the direction of incidence.

In a further preferred embodiment of the present invention, the sections between the regions of multiple lines in which the subcritical cracks have propagated crack as a result of the stresses or the introduction of the external force that are generated, for example, by the glass transition or the ultrasound treatment. This embodiment is advantageous since, owing to the existing damage already brought about in the interior of the solid-state body, especially owing to the subcritical cracks, the stresses required can be much lower. Moreover, the crack is run very precisely.

In a further preferred embodiment of the present invention, the absorbing layer is disposed or produced on a surface of the solid-state body that lies on the opposite side from the surface of the solid-state body where the layers and/or components for forming of the composite structure are disposed.

Prior to the triggering of the crack, the absorbing layer according to the process, especially in the form of a polymer film, is applied on the side of the solid-state body where there are preferably no further layer and/or components disposed.

In a further preferred embodiment of the present invention, the absorbing layer, in terms of mass, at least mainly and preferably entirely consists of the polymer material, where the glass transition of the polymer material is between −130° C. and 0° C., especially between −85° C. and −10° C. or between −80° C. and −20° C. or between −65° C. and −40° C. or between −60° C. and −50° C.

In a further preferred embodiment of the present invention, the polymer material of the absorbing layer consists of or includes a polymer hybrid material which forms a polymer matrix, where there is a filler in the polymer matrix, where the polymer matrix is preferably a polydimethylsiloxane matrix and where the proportion by mass of the polymer matrix in the polymer hybrid material is preferably 80% to 99% and more preferably 90% to 99%.

According to the invention, therefore, a polymer hybrid material is specified for use in a splitting method in which at least two solid-state fragments are generated from a solid-state starting material. The polymer hybrid material of the invention comprises a polymer matrix and at least one first filler embedded therein. Where mention is made hereinafter of a or the filler, the possibility of multiple fillers shall likewise be included. For example, the filler may comprise a mixture of different materials, e.g. metal oxides, metal particles and inorganic fibers.

The polymer matrix utilized may be any polymer or a mixture of different polymers, with the aid of which it is possible to generate the stresses needed for a division of the solid-state starting material. For example, the polymer matrix may take the form of an elastomer matrix, preferably of a polydiorganosiloxane matrix, more preferably of a polydimethylsiloxane matrix. Such polymer materials can be utilized in a particularly simple manner as matrix material in combination with fillers since the properties can be flexibly adjusted owing to the variable degree of crosslinking and matched to the respective filler and the solid-state starting material to be divided. In one embodiment, the proportion by mass of the polymer matrix in the polymer hybrid material is 80% to 99%, preferably 90% to 99%.

The first filler may be organic or inorganic in nature and may consist either of a chemical element or of a chemical compound or of a mixture of substances, for example an alloy.

The constitution of the first filler is such that it acts as reactant, initiator, catalyst or promoter during the detachment of the polymer hybrid material from the solid-state fragment after the division and hence leads, by comparison with a polymer material without first filler, to faster detachment of the polymer hybrid material from the solid-state fragment after the division.

The specific chemical composition and configuration of the first filler and the proportion by mass thereof is dependent especially on the specific material of the polymer matrix that is to be detached, the solvent utilized for the purpose, and the reactants used. In addition, the material of the solid-state starting material and the dimensions of the solid-state starting material to be divided also play a role.

The specific proportion of the first filler in the polymer matrix is highly dependent on the filler material and its mode of action. Firstly, the polymer matrix, in spite of the filler, must still be able to fulfill its function of generating stresses. Secondly, the proportion of the first filler must be high enough to achieve the desired influence on the removal of polymer. The optimal proportion by mass of the first filler in each case can be ascertained by the person skilled in the art in simple experiments conducted in a concentration-dependent manner.

A contribution to an improvement in mechanical properties may additionally be made by a further filler, for example fumed silica in the form of an inorganic network in the polymer. As well as these strong interactions in the form of the network, it is also possible for less strong interactions to make a contribution to the improvement via purely hydrodynamic reinforcements. An example that may be mentioned here is a controlled increase in viscosity that enables improved processing in the splitting method and hence can contribute to improved manufacturing tolerances. In addition, this interaction makes it difficult for there to be any reduction in the internal degrees of freedom with regard to structural reorientation with increasing reinforcement.

This leads to a desired lowering of the glass transition temperature of the polymer used in the polymer hybrid material, which enables the advantage of a lower temperature in the splitting method. According to the invention, the first filler in a polymer hybrid material is used for acceleration of the detachment of the polymer hybrid material from a solid-state fragment which is obtained by division by means of a splitting method in which a solid-state starting material is divided into at least two solid-state fragments.

The first filler may be distributed in the polymer matrix in such a way that the proportion by mass of the first filler decreases proceeding from the outer, i.e. lower, interface of the polymer hybrid material which is joined to the solid-state starting material during the splitting method in the direction of a further interface of the polymer hybrid material arranged parallel to the lower interface. This means that the proportion by mass of the filler close to the solid-state starting material or fragment is greater than in the other regions of the polymer hybrid material. This distribution of the first filler enables particularly effective removal of the polymer hybrid material after the separation since the first filler is close to the interface to the solid-state fragment and can display its effect there. At the same time, the remaining regions of the polymer hybrid material include less or even zero fractions of the first filler, such that there is a minimum influence on the function of the polymer.

In one configuration, the polymer hybrid material has a layered construction, with only a layer facing the solid-state starting material including the first filler, while the rest of the polymer hybrid material is free of the first filler.

In addition, a lower region of the polymer hybrid material that directly adjoins the lower interface thereof may be free of the first filler. Thus, the resultant sequence of regions may be as follows: adjacent to the solid-state starting material is firstly a region with no first filler, followed by a region with a high proportion of first filler and then by a region having a low proportion of first filler or having no first filler.

These and all the regions described hereinafter may take the form of layers, meaning that the region extends predominantly parallel to the interface of the solid-state starting material to which the polymer hybrid material is applied and has a longitudinal and transverse extent at least in the region of this interface.

A lower region without first filler may especially be provided if the first filler worsens the adhesion of the polymer hybrid material to the solid-state starting material. In order to avoid this, a region without first filler is first disposed, followed by a region with a high proportion of first filler in order that the first filler can fulfill its function. A lower region without first filler may have a thickness, for example, between 10 μm and 500 μm, for example 100 μm.

In addition, an upper region of the polymer hybrid material that directly adjoins the upper interface thereof may be free of the first filler. The lower interface is understood to mean the interface that bounds the polymer hybrid material from the environment at the opposite side from the lower interface and from the solid-state starting material. The upper and lower interface may be arranged parallel to one another.

Such an upper region without first filler may be provided especially when the first filler adversely affects the heat transfer between the environment and polymer hybrid material, for example if the cooling of the polymer hybrid material were to be delayed.

The first filler may comprise or consist of a material that can react with a reactant, preferably an oxidant, with release of a gaseous product.

It is thus possible to generate cavities in the polymer matrix that enable faster access by the reactants and solvent to the polymer matrix and any sacrificial layer present and additionally bring about faster transporting-away of the reactants and dissolved constituents.

The generation of gaseous reaction products can introduce additional driving forces that further assist the removal of the polymer hybrid material.

The formation of additional cavities and of gaseous reaction products accelerates the removal of polymer and therefore contributes to an increase in the overall yield of the splitting method. By varying the proportion of first filler, it is possible to influence the cavity density in the interface region between solid-state fragment and polymer hybrid material or between sacrificial layer and polymer hybrid material in a controlled manner.

The first filler may comprise a metal, especially aluminum, iron, zinc and/or copper, or consist of a metal, especially the aforementioned metals.

In relation to all the materials mentioned in the present context, "consisting of" includes the possibility that impurities for technological reasons or additions for technological reasons that may serve, for example, for production of the fillers and their distribution or binding to the polymer matrix may be present.

Metallic fillers may react with oxidizing agents, for example hydrochloric acid, nitric acid, citric acid, formic acid or sulfamic acid, with release of a gaseous product and hence be removed from the polymer hybrid material.

For example, aluminum reacts with concentrated hydrochloric acid to form solvated metal ions and hydrogen according to the following equation:

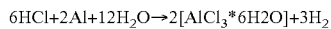

$$6HCl+2Al+12H_2O \rightarrow 2[AlCl_3 * 6H2O]+3H_2$$

In a similar manner, the reaction of zinc as filler by reaction with concentrated hydrochloric acid leads to formation of 5 additional cavities: $Zn+2\ HCl \rightarrow ZnCl_2+H_2$ In the examples mentioned, the generation of hydrogen introduces additional driving forces that further assist the removal of the polymer hybrid material. In addition, the first filler can improve the thermal conductivity within the polymer hybrid material, for example in that the first filler has a higher thermal conductivity than the polymer of the polymer matrix. This may be the case, for example, when A further advantage in the case that the first filler comprises a metal lies in the improved thermal conductivity within the polymer hybrid material. Thereby By virtue of an improved thermal conductivity are the stresses generated by means of cooling for the division of the solid-state starting material can be generatable more effectively, i.e. more quickly and with lower consumption of coolant. This increases can increase the overall yield of the splitting method.

In addition, a second 25 filler may be provided in the polymer hybrid material, which increases the adhesion of the polymer hybrid material on the solid-state starting material by comparison with a polymer hybrid material without second filler. Preferably, the adhesion is increased by comparison with a polymer material without filler.

For example, the second filler may be a filler that can be activated by means of plasma. Plasma activation results in new surface species that can be created so as to result in stronger interaction with the surface of the solid-state starting material and, ultimately, the adhesion of the polymer hybrid material is improved.

The nature of the surface species achievable by the plasma treatment is dependent primarily on the process regime of the plasma process. For example, during the plasma treatment, gases such as nitrogen, oxygen, silanes or chlorosilanes may be added, so as to give rise to polar groups, for example, which can interact more strongly with the surface of the solid-state starting material.

The second filler may be distributed 15 in the polymer matrix in such a way that the proportion by mass of the second filler increases in the direction of the lower interface. For example, the polymer hybrid material may contain the second filler only in a region adjoining the lower interface, where the region may also take the form of a layer in the sense of the abovementioned definition.

This enables the arrangement of the second filler preferably close to the interface between polymer hybrid material and solid-state starting material, which improves the adhesion and hence enables better force transmission into the solid-state starting material to be divided. For example, the second filler may comprise core-shell polymer particles.

Preference is given here to particles having a polymer composition that differs from the polymer matrix of the polymer hybrid material in that the surface, i.e. the shell, of the core-shell particles in particular is more strongly activatable, for example by means of low-temperature plasma.

Examples of these are core-shell particles comprising a polysiloxane core with an acrylate shell or comprising a nanoscale silicate core with an epoxide shell or comprising a rubber particle core with an epoxide shell or comprising a nitrile rubber particle core with an epoxide shell. The second filler may be activatable by means of low-temperature plasma, for example cold plasma. For example, the plasma may be generated by means of dielectric barrier discharge (DBD). It is possible here to generate electron densities in the range from 1014 to 1016 m-3. The average temperature of the "cold" non-equilibrium plasma (plasma volume) generated by DBD is about 300±40 K at ambient pressure. The average temperature of the non-thermal plasma generated by DBD is about 70° C. at ambient pressure.

In the case of DBD treatment, the surface is subjected, for example, to uni- or bipolar pulses of pulse durations of a few microseconds to a few tens of nanoseconds and amplitudes in the single-digit to double-digit kilovolt range. No metallic electrodes are to be expected here in the discharge space, and hence no metallic impurities or electrode wear.

A high efficiency is additionally advantageous since no charge carriers have to exit from or enter the electrodes.

Dielectric surfaces may be modified and chemically activated at low temperatures. The surface modification can be effected, for example, by an interaction and reaction of the surface species by ion bombardment.

In addition, it is possible to specifically add process gases, for example nitrogen, oxygen, hydrogen, silanes or chlorosilanes, e.g. $Si_xH_yE_z$ with E=F, Cl, Br, I, O, H and x=0 to 10, z=0 to 10, $SiH_4$, $Si(EtO)_4$ or $Me_3SiOSiMe_3$, in a plasma treatment in order to generate, for example, particular chemical groups at the surface. The second filler may additionally be activatable by means of corona 5 treatment, flame treatment, fluorination, ozonization or UV treatment, or excimer irradiation. Such activation generates polar groups, for example, at the surface of the second filler, which can interact with the surface of the solid-state starting material and hence improve the adhesion. The polymer hybrid material may also additionally, by comparison with a polymer hybrid material having a first filler or with a polymer hybrid material having a first and second filler, comprise a third filler. This third filler has higher thermal conductivity and/or a higher modulus of elasticity compared to the polymer of the polymer matrix.

For example, the modulus of elasticity of the polymer under low-temperature conditions is in the lower single-digit gigapascal range (about 1-3 GPa), whereas, for example, metallic fillers have a modulus of elasticity in the double-digit to triple-digit gigapascal range. In the case of a corresponding high filler content, a percolating filler network is possible, which enables improved introduction of force into the solid-state starting material.

The percolation is significantly influenced by the degree of volume filling of the respective fillers (e.g. 0.1% by volume, 1 30% by volume to 10% by volume according to the aspect ratio). With increasing introduction of force, the viscoelastic layer construction of the polymer structure can be immersed and multiple percolation pathways become active. It is possible here to enable improved heat transfer since there can be improved contact of the fillers with the surface of the solid-state starting material.

The mechanical stability of the polymer hybrid material is more rapidly attained even at low temperatures. The overall result is a lower standard deviation in the corresponding profiles of structure properties, for example breaking stress and elongation at break of the polymer hybrid material, and hence an increase in the overall yield of the splitting method. The spatially resolved changes in the profile of properties (tension peaks in the polymer hybrid material) and hence in the solid-state body are smaller, which leads to a higher overall yield of the splitting method and a better quality of the solid-state fragments produced.

The third filler can bring about improved heat transfer between the environment and polymer hybrid material and faster conduction of heat within the polymer hybrid material, such that the polymer hybrid material can be cooled more quickly and the splitting method can be performed rapidly and hence more effectively overall.

An increase in the modulus of elasticity can achieve higher stresses for the division of the solid-state starting material, such that it is also possible to divide solid-state starting materials for which particularly high stress is required.

Moreover, the third filler can also serve to influence the coefficient of thermal expansion. The aim here is a maximum difference between the coefficients of thermal expansion of the polymer hybrid material and the solid-state starting material to be divided, in order to additionally be able to generate stresses necessary for the division. Preferably, the third filler has a high coefficient of thermal expansion, i.e. a coefficient of expansion higher than that of the polymer matrix. For example, the coefficient of thermal expansion of the third filler may be more than 300 ppm/K.

The third filler may be distributed in the polymer matrix such that the proportion by mass of the third filler increases in the direction of the upper interface in order to enable more rapid heat transfer especially at the interface to the environment.

The third filler may comprise a metal, especially aluminum, iron, zinc and/or copper, or consist of one of the metals mentioned. Metals are generally notable for a high heat conductivity and thermal conductivity.

The fillers described (first, second, third filler) may be distributed in particulate form in the polymer matrix, and the particle size may be in the μm and nm range, based on at least one dimension of the particle. As well as a spherical shape, the filler particles may also assume different configurations, for example a rod or disk shape.

The filler particles may have any particle size distribution, for example monomodal or bimodal, narrow, especially monodisperse, or broad. The fillers may be either physically bound, for example by embedding into the polymer network, or chemically bound to the polymer matrix. In addition, one or more of the fillers described may comprise or consist of inorganic or organic fibers, for example carbon, glass, basalt or aramid fibers, provided that the functions described above are reconcilable therewith. It is optionally also possible to add a further filler that comprises or consists of the fibers mentioned.

Fibers typically have strongly anisotropic properties. By direction-dependent positioning of the filler in the polymer hybrid material, it is possible to influence the stresses needed for the division of the solid-state starting material in a controlled manner. This can contribute to an increase in the overall yield of the splitting method. An additional advantage, in the case that an organic or inorganic filler is used as fibrous material having a strongly anisotropic structure, is that this can achieve an improvement in the mechanical properties within the polymer hybrid material.

The fillers described may additionally comprise or consist of core-shell particles. Additionally or alternatively, a further filler comprising or consisting of core-shell particles may be provided in the polymer hybrid material.

The use of core-shell polymer particles additionally allows, as well as improved activatability, also a new configuration of energy-absorbing mechanisms that can lead overall to an increase in impact resistance and fracture toughness, especially an increase in low-temperature fracture resistance, of the polymer hybrid material in the case of use in the splitting method, and hence can likewise contribute to a higher overall yield of the splitting method. For example, mechanical destruction of a film of a polymer hybrid material may be less likely to occur, and so the possibility of reuse of the film can be promoted.

By way of example, by preventing crack propagation owing to core-shell polymer particles, it is possible to prevent destruction of the film in the splitting method and hence to open up reutilization pathways.

It is possible here for elastomer particles present to undergo plastic deformation and form cavities, which means that further additional energy can be absorbed. Additional absorption of energy can likewise be compensated for by the shear flow of the matrix, which improves mechanical properties overall. It is a feature of core-shell particles that a generally spherical core made of one material is surrounded by a shell made of a second material. The shell may either completely surround the core or alternatively be permeable. The materials may either be inorganic materials, for example metals, or organic materials, for example polymers. For example, it is possible to combine two different metals with one another. Alternatively, it is possible to surround a core made of a polymer with a shell made of a metal or a second polymer.

Core-shell particles enable the combination of the properties of the first and second materials. For example, by means of an inexpensive polymer core, it is possible to fix the size and density of the filler particles, while the metallic shell can react as described above. Owing to their often monodisperse particle size distribution, the properties of the core-shell particles can additionally be precisely predicted and adjusted.

Furthermore, one or more fillers (first, 5 second and/or third filler) may comprise or consist of carbon in the form of carbon black, graphite, chopped carbon fibers, carbon nanofibers, preferably in the form of carbon nanotubes (CNTs), for example multiwall carbon nanotubes (MWCNTs) and single-wall carbon nanotubes (SWCNTs). Carbon nanotubes are cylindrical graphite layers formed from a different number of cylinders.

If these tubes consist of just one cylinder, they are referred to as single-wall carbon nanotubes (SWCNTs). If two or more cylinders are present, the result is either double-wall carbon nanotubes (DWCNTs) or multiwall carbon nanotubes (MWCNTs). These may preferably be in concentrically nested form.

In various embodiments, the third filler may comprise or consist of MWCNTs since these have particularly high thermal conductivity (>3000 $W*(m*K)^{-1}$) and at the same time have very high tear resistance in the range of 5-60 GPa. The high mechanical stability is manifested in high tear resistance values, extreme elasticity and very good durability of the filler.

This is based on the sp2-hybridized strong σ-C—C bonds combined with a delocalized p orbital as the π bond to three adjacent carbon atoms. Torsions of up to 90° are possible here.

SWCNTs can achieve even higher property values (modulus of elasticity: 410 GPa to 4150 GPa vs. graphite: 1000 GPa, SWCNTs: thermal conductivity about 6000 $W*(m*K)^{-1}$). However, a poorer cost/benefit ratio is found here compared to MWCNTs. The cylinder diameters of MWCNTs are typically in the range from 1 nm to 100 nm, preferably from 5 to 50 nm, with a length of 500 nm to 1000 µm.

In further embodiments, the third filler may comprise MWCNTs and, at the same time, the second and/or first filler may comprise or consist of carbon black, since it is likewise possible here to achieve an improvement in thermal conductivity (for example up to 200 $W*(m*K)^{-1}$). Since the use of carbon black, by way of example, has a distinctly lower tear resistance with values of <0.4 GPa, a combination of both or further fillers is possible and can lead to an improvement in the overall splitting yield and to an improvement in the overall costs in the splitting method.

20 The average diameters here of the carbon black particles are in the range from 5 nm to 500 nm, preferably from 20 nm to 200 nm, more preferably from 40 nm to 100 nm.

In addition, the fillers may comprise or consist of silica; for example fumed silica. 25 Additionally or alternatively, a further filler comprising or consisting of silica may be provided in the polymer hybrid material.

Fumed silica may form a three-dimensional network and hence contribute to an improvement in mechanical 30 stability. Thus, such a filler may serve for controlled adjustment of the mechanical properties of the polymer hybrid material. One or more of the fillers mentioned (first, second, third filler) may consist of the same material if it is reconcilable with the function ascribed to it. For example; both the first and third fillers may comprise aluminum or consist of aluminum. Aluminum can be utilized as described above both for generation of cavities and hence for acceleration of the detachment of the polymer hybrid material from the solid-state fragment and for an increase in thermal conductivity. Such a configuration simplifies the manufacturing process since it may be sufficient to add just one or two fillers in order to fulfill all functions.

The first and second and any third filler may also consist of different materials. This enables individual and hence better adaptation of the filler to the desired function.

A film of the invention comprises a polymer hybrid material as described above. The film may have a thickness of, for example, 0.5 to 5 mm.

A polymer hybrid material of the invention or a film of the invention is applied to at least this surface, so as to result in a corresponding composite structure. The polymer hybrid material applied and the film applied are also referred to hereinafter as absorbing layer. The thickness of such a absorbing layer may, for example, be between 0.5 mm and 5 mm, especially between 1 mm and 3 mm. Optionally, the polymer hybrid material or film may also be applied to multiple exposed surfaces, especially to surfaces in a mutually parallel arrangement.

The thermal stress preferably constitutes cooling of the absorbing layer below ambient temperature and preferably below 10° C. and more preferably below 0° C. and further preferably below −10° C. or below −40° C.

The cooling of the absorbing layer is most preferably effected in such a way that at least some of the absorbing layer undergoes a glass transition, or else undergoes partial or complete crystallization. The cooling here may be a cooling operation to below −130° C., which can be brought about, for example, by means of liquid nitrogen. This embodiment is advantageous since the absorbing layer contracts and/or undergoes a glass transition as a function of the change in temperature and the resultant forces are transmitted to the solid-state starting material, by means of which mechanical stresses can be generated in the solid-state body and lead to triggering of a crack and/or to crack propagation, with spreading of the crack initially in the first detachment plane for splitting-off of the solid-state layer.

In a further step, the polymer hybrid material or the film is removed from the solid-state fragment, for example by a chemical reaction, a physical detachment operation and/or mechanical material removal.

The operation of detachment of the polymer hybrid material from the solid-state fragment can take place at moderate ambient temperature, for example in the range from 20° C. to 30° C., preferably in the higher temperature range from 30° C. to 95° C., for example from 50° C. to 90° C., or else, for example, in a lower temperature range between 1° C. and 19° C.

The elevated temperature range can enable shortening of a chemical detachment reaction owing to an increase in the reaction rate, for example in the case of use of a sacrificial layer between the polymer hybrid material and the solid-state body. In the case of use of a sacrificial layer, the detachment can be effected in aqueous solution, advantageously at a pH in the range of 2-6. In various embodiments, by way of example, the detachment operation can be effected in the form of a treatment with a solution of a suitable apolar solvent, preference being given to moderate ambient temperatures in the range from 1° C. to 50° C. and particular preference to from 20° C. to 40° C.

A particular advantage here is detachment without thermal treatment of the film. It is advantageously possible here to employ aliphatic and aromatic hydrocarbons, for example toluene, n-pentane, n-hexane, but also halogenated solvents, for example carbon tetrachloride. It is possible here to introduce additional forces into the polymer hybrid material to be detached and the interface to the solid-state fragment since a solvent treatment can result in occurrence of very significant reversible swelling of the polymer hybrid material, which simplifies detachment overall.

In further embodiments, a combination with the above-described mechanism of detachment of the sacrificial layer and treatment with a suitable apolar solvent can be effected likewise without thermal treatment of the film.

On the exposed layer or the exposed components of the composite structure generated, it is possible to arrange or generate a stabilization layer for bounding of deformations of the exposed layer or the exposed components, said deformations resulting from the mechanical stresses introduced by means of the absorbing layer. The side with components is thus preferably protected and held (for example to counter warping of the substrate or of the solid-state body and gray room conditions). This can be accomplished via soluble polymers (organics) or holding layers. This embodiment is advantageous since it can limit interaction with small MEMS structures, for example. The surface characteristics of a wafer executed with components is usually not regular, which, in the event of excessive or abrupt movements, can lead to excess field increases and local surface damage. Thus, this embodiment is a solution that brings about good protection of the solid-state layer and of the layers and/or components disposed and/or generated thereon, especially from mechanical damage or destruction.

The method may preferably likewise or alternatively include one or more of the steps of: providing a solid-state body for separation of at least one solid-state layer, wherein the solid-state body has a first planar area component and a second planar area component, wherein the first planar area component is preferably aligned essentially or exactly parallel to the second planar area component.

Generating defects by means of at least one radiation source, especially a laser, in the internal structure of the solid-state body to define a crack triggering site, proceeding from which the solid-state layer is separated from the solid-state body.

Generating defects or modifications by means of laser beams from at least one laser in the internal structure of the solid-state body to define a crack progression along which the solid-state layer is separated from the solid-state body, wherein the laser beams penetrate into the solid-state body through the second planar area component.

In a further preferred embodiment of the present invention, the stabilization layer consists of or includes a preferably water-soluble ceramic, especially Fortafix from Detakta, and/or a soluble polymer, especially polyethylene glycol) (PEG), especially with different and/or adjusted chain lengths. Fortafix is a one- and two-component ceramic cement for use as adhesive, enamel for protection from corrosion and chemical effects, casting compound for mold construction or for insulation, as dipping compound for securing of heating wires, for the insetting of knife blades, for example in metal or ceramic grips. The polymer (PEG) is soluble in water and a number of organic solvents. It is insoluble in hexane, diethyl ether and tert-butyl methyl ether—i.e, other organic solvents. Accordingly, the surface structures/components may be filled with PEG before a protective layer is applied. The stabilization layer is preferably generated in situ or provided as a film. Additionally or alternatively, the stabilization layer is cast or the layer and/or the exposed components are contacted with liquid material which only becomes the stabilization layer through curing or solidification. The stabilization layer is additionally or alternatively removed from the layer or the exposed components by applying a solvent or by dipping into a solvent. The stabilization layer thus includes or consists of a ceramic material and/or it includes or consists of a polymer material.

In a further preferred embodiment of the present invention, the modifications are successively generated in at least one line or row, wherein the modifications generated in a line or row are preferably generated at a distance X and with a height H in order that a crack that propagates between two successive modifications, especially a crack that propagates in crystal lattice direction, the direction of crack propagation of which is aligned at an angle W relative to the detachment plane, connects the two modifications to one another. The angle W here is preferably between 0° and 6°, especially 4°. Preferably, the crack propagates from a region beneath the center of a first modification toward a region above the center of a second modification. The essential relationship here is therefore that the size of the modification can/must be altered depending on the separation of the modifications and the angle W.

In a further preferred embodiment of the present invention, in a first step, the modifications are generated on a line and preferably at the same distance from one another. It is additionally conceivable that a multitude of these lines generated in the first step are generated. These first lines are more preferably generated parallel to the direction of crack propagation and preferably in a straight line or in the form of an arc, especially in the same plane. After the generation of these first lines, second lines for detachment and/or driving of preferably subcritical cracks are preferably generated. These second lines are likewise generated preferably in a straight line. More preferably, the second lines are in an inclined, especially orthogonal, alignment relative to the first lines. The second lines preferably extend in the same plane as the first lines or more preferably in a plane parallel to the plane in which the first lines extend. Subsequently, third lines are preferably generated to connect the subcritical cracks.

In a further preferred embodiment of the present invention, a cooling device is provided for cooling of the absorbing layer to a temperature between −130° C. and −10° C., especially to a temperature between −80° C. and −50° C. The cooling device preferably includes a nebulizer, especially at least or exactly one perforated pipeline, for nebulization of liquid nitrogen, and the cooling effect is more preferably generated by nebulized nitrogen. Alternatively, it is conceivable that the cooling device has a nitrogen bath, wherein the absorbing layer is positioned at a distance from the liquid nitrogen held in the nitrogen bath. Alternatively, it is conceivable that the cooling device is provided a spraying means that preferably uniformly provides nitrogen, especially in liquid or nebulized form, wherein the spraying means is preferably disposed above and/or to the side of the absorbing layer. This embodiment is advantageous since the liquid nitrogen is of very good suitability for defined cooling of objects. In addition, this embodiment is advantageous since a very much more energy-efficient process is provided compared to low-temperature processes of less than −80° C. or of less than −96° C.

The cooling device preferably has a nitrogen bath and a positioning device in order to defined setting of the distance of the position of the absorbing layer from the liquid nitrogen held in the nitrogen bath, wherein the nitrogen bath and the positioning device are preferably disposed in a space at least partly and preferably completely delimited from the environment.

In a further preferred embodiment of the present invention, one or more temperature measurement device(s) is/are provided. With the temperature measurement device(s) and temperature measurement(s) are preferably conducted, wherein the temperature values detected are preferably used to control the setting or flow through a nitrogen valve for temperature control.

For more homogeneous temperature control, it is also possible to use a ventilator within the chamber, which generates forced convection and hence reduces temperature gradients.

A further cooling option (not depicted) is contact cooling with a temperature-controlled cooling body through which, for example, a coolant flows in a closed circuit and is brought into contact with the solid-state body.

The temperature is preferably measured on the solid-state body, especially on the absorbing layer and/or on the underside of the solid-state body; the underside of the solid-state body is preferably disposed spaced apart from the bottom of the chamber, the solid-state body preferably being positioned by provision of a positioning device, by means of which the distance of the solid-state body from the bottom of the chamber or the distance of the absorbing layer from liquid nitrogen is more preferably variable, especially in a temperature-dependent manner.

In addition, a chamber is preferably provided to accommodate the nitrogen and the positioning device, said chamber preferably being sealable and/or thermally insulated from the environment.

According to the present description, a solid-state starting material is preferably understood to mean a monocrystalline, polycrystalline or amorphous material. Owing to the highly anisotropic atomic bonding forces, preference is given to monocrystalline materials having a highly anisotropic structure. The solid-state starting material preferably includes a material or material combination of one of main groups 3, 4, 5 and/or of transition group 12 of the Periodic Table of the Elements, especially a combination of elements from main groups 3, 4, 5 and transition group 12, for example zinc oxide or cadmium telluride.

As well as silicon carbide, the semiconductor starting material may also include, for example, silicon, gallium arsenide GaAs, gallium nitride GaN, silicon carbide SiC, indium phosphide InP, zinc oxide ZnO, aluminum nitride AlN, germanium, gallium(III) oxide $Ga_2O_3$, aluminum oxide $Al_2O_3$ (sapphire), gallium phosphide GaP, indium arsenide InAs, indium nitride InN, aluminum arsenide AlAs or diamond.

The solid-state body or workpiece (e.g. wafer) preferably includes a material or material combination of one of main groups 3, 4 and 5 of the Periodic Table of the Elements, for example SiC, Si, SiGe, Ge, GaAs, InP, GaN, $Al_2O_3$ (sapphire), AlN. More preferably, the solid-state body includes a combination of the elements that occur in the fourth, third and fifth groups of the Periodic Table. Conceivable materials or material combinations here are, for example, gallium arsenide, silicon, silicon carbide, etc. In addition, the solid-state body may include a ceramic (e.g. $Al_2O_3$-aluminum oxide) or consist of a ceramic; preferred ceramics here are; for example, perovskite ceramics (for example Pb-, O-, Ti/Zr-containing ceramics) in general and lead magnesium niobates; barium titanate; lithium titanate, yttrium aluminum garnet, especially yttrium aluminum garnet crystals for solid-state laser applications, surface acoustic wave (SAW) ceramics such as lithium niobate; gallium orthophosphate, quartz, calcium titanate, etc. in particular. The solid-state body thus preferably includes a semiconductor material or a ceramic material, and the solid-state body more preferably consists of at least one semiconductor material or a ceramic material. The solid-state body is preferably an ingot or wafer. The solid-state body is more preferably a material at least partly transparent to laser beams. It is thus also conceivable that the solid-state body includes a transparent material or consists of or has been manufactured partly from a transparent material; for example sapphire. Further materials that are useful here as solid-state material on their own or in combination with another material are, for example, "wide band gap" materials; InAlSb, high-temperature superconductors, especially rare earth caprates (e.g. $YBa_2Cu_3O_7$). It is additionally or alternatively conceivable that the solid-state body is a photomask; where the photomask material used in the present case may preferably be any photomask material known up to the filing date and more preferably combinations thereof. In addition, the solid-state body may additionally or alternatively include or consist of silicon carbide (SiC).

The modifications may be a phase transformation of silicon carbide to silicon and carbon.

The laser exposure of the invention preferably has the effect of a substance-specific location-resolved cumulation of the energy input, which results in a defined heat treatment of the solid-state body at a defined location or at defined locations and in a defined time. In a specific application, the solid-state body may consist of silicon carbide, as a result of which a highly locally limited heat treatment of the solid-state body to a temperature of, for example, more than 2830+/−40° C. is preferably undertaken. This heat treatment results in novel substances or phases, especially crystalline and/or amorphous phases, the resulting phases preferably being Si (silicon) and DLC (diamond-like carbon) phases formed with distinctly reduced strength. This layer of reduced strength then gives rise to the detachment region or detachment plane.

In addition, the aforementioned object is achieved by a solid-state body that has been produced by an aforementioned method and has at least one detachment plane within the solid-state body, wherein the detachment plane is formed from modifications that have been generated by means of laser radiation. In addition, the solid-state body has a region resulting from a high-temperature treatment method.

In a further preferred embodiment, the layer(s) and/or components(s) have been disposed or generated in the region. Alternatively, the layer(s) and/or component(s) may have been disposed or generated on a surface of the solid-state layer to be removed. The solid-state body preferably has a thickness or average thickness of less than 1000 μm, especially of less than 800 μm or 700 μm or 600 μm or 500 μm or 400 μm or 300 μm or 200 μm or 100 μm or 80 μm or 50 μm.

The invention thus also provides for the production of components on such a pretreated/modified wafer and the modified wafer as component substrate itself.

The present invention further relates, according to claim 15, to a multicomponent arrangement. The multicomponent arrangement of the invention is preferably generated by means of claim 1 or claim 2 and more preferably has at least one solid-state layer. The solid-state layer preferably consists to an extent of more than 50% (by mass), especially to an extent of more than 75% (by mass) or to an extent of more than 90% (by mass) or to an extent of more than 95% (by mass) or to an extent of more than 98% (by mass) or to an extent of more than 99% (by mass) of SiC, where the solid-state layer, in the region of a first surface, includes modifications or modification constituents that generate compressive stresses, where the modifications are amorphized (phase-transformed) constituents of the solid-state layer, where the modifications are at a shorter distance from, or form part of, the first surface than from a second surface, where the second surface is formed parallel or essentially parallel to the first surface, where the first surface is planar or essentially planar and/or where the second surface is planar or essentially planar. In addition, the multicomponent arrangement of the invention likewise includes a metal layer generated on the first surface of the solid-state layer. In addition, it is possible that one or more further layers and/or one or more further components are disposed on the second surface, especially for formation of electrical components that can be used as horizontal or vertical components.

Preferably, the modifications are spaced apart from the second surface by less than 200 μm, especially less than 150 μm or less than 110 μm or less than 100 μm or less than 75 μm or less than 50 μm.

A surface in the context of the present invention should preferably be regarded as essentially planar when every square centimeter of the surface, when the surface is laid on an ideal smooth and ideally planar surface, has at least one constituent in contact with the ideally smooth and ideally planar surface.

A surface in the context of the invention should preferably be regarded as planar when every square centimeter, especially square millimeter, of the surface, when the surface is laid on an ideal smooth and ideally planar surface, at least has multiple, especially at least 2, 3, 4 or 5, constituents in contact with the ideally smooth and ideally planar surface.

In addition, the subject matter of patent application DE 10 2016 123 679.9, filed at the German Patent and Trademark Office on Dec. 7, 2016, is fully incorporated by reference into the subject-matter of the present property right specification.

Further advantages, aims and properties of the present invention are elucidated by the description of appended drawings that follows, in which the separation method of the invention is detailed by way of example. Components or elements that are used with preference in the method of the invention and/or that at least essentially correspond in terms of their function in the figures may be identified here by identical reference numerals, with no need for numbering or elucidation of these components or elements in all figures.

These show:

FIG. 1*a-f* a treatment procedure of the invention,

FIG. 2*a-b* two schematic examples of solid-state arrangements as can be provided in accordance with the invention, FIG. 3*a-i* further schematic examples of solid-state arrangements of the invention or solid-state arrangements that can be generated in the process of the invention as intermediate, FIG. 4 a schematic diagram of two lines formed by modifications, FIG. 5*a-d* various cooling devices that are preferably usable for cooling in the method of the invention.

FIG. 6*a-c* three different schematic examples for crack propagation between modifications, FIG. 7 differently oriented modification lines to bring about different functions, FIG. 8 an example of a Schottky diode, FIG. 9 an example of a MOSFET.

FIG. 1*a* shows the provision of the solid-state body 1, especially a wafer.

According to FIG. 1*b*, the solid-state body 1 provided is coupled or stuck or welded or screwed or clamped onto a tool carrier (chuck) 3, where the tool carrier preferably comprises a cooling functionality and hence preferably becomes the cooling device 3. The solid-state body 1 is preferably fixed, especially stuck, onto the cooling device 3 in longitudinal direction by its underside, which is preferably opposite the surface 5 in longitudinal direction. The laser beams are thus introduced into the solid-state body 1 in the direction of the cooling device 3 via the surface 5, which is part of the solid-state layer to be removed, to generate the modifications 9.

In addition, there is more preferably a high-temperature treatment of the surface 5, especially an epitaxial material arrangement on the solid-state surface 5, which preferably results in a further layer 145 or multiple further layers 145. The at least one high-temperature method is preferably an epitaxial method, a doping method or a method using plasma, wherein the high-temperature method, especially in the case of an epitaxial method, generates at least one layer 145 on the solid-state body 1, where the at least one layer 145 generated has predefined parameters, where at least one predefined parameter defines a maximum degree of refraction and/or absorption and/or reflection of laser light waves, where the degree of refraction and/or absorption and/or reflection is less than 5% and preferably less than 1% and more preferably less than 0.1%. In addition, the layer 145 generated or the further layers 145 generated may preferably be metal-free.

FIG. 1*c* shows a schematic of the generation of modifications 9 by means of the laser beams. The laser beams preferably penetrate here into the solid-state body 1 via the layer 145 generated by means of the high-temperature method beforehand. However, it is alternatively likewise conceivable that the laser beams penetrate into the solid-state body 1 via a clear surface, i.e. one not coated with the further layer 145, of the solid-state body 1, especially from below. The solid-state body here 1 is preferably held laterally or on the outer ends (width and/or depth direction).

FIG. 1*d* shows a schematic section diagram of the solid-state body 1 after the generation of modifications 9. In this example, 4 blocks of modifications 9 are apparent, which lead to 4 crack components 25, 27, 28, 29. Adjoining the blocks with modifications 9, reference numerals 41, 42, 43, 44 and 45 each indicate regions without modifications 9 or regions in which fewer modifications 9 are generated than in the regions in which the blocks of modifications 9 are generated.

FIG. 1*e* shows a state in which a receiving layer, especially including a polymer material, is disposed or generated on further components (not shown) that are disposed on the surface 5 or on a further layer generated epitaxially on the surface 5 beforehand. The receiving layer has preferably been generated as a film and, after generation thereof, has been coupled, especially bonded or stuck, to the surface 5. However, it is likewise possible to form the receiving layer by applying a liquid polymer to the surface 5 and then solidifying.

Between the step of generating the modifications and applying the receiving layer, there is preferably a disposal or generation of further layers 150 and/or components 150 on the surface 5 or on a further layer 145 already generated thereon during an upstream high-temperature method.

FIG. 1*f* shows a schematic of a temperature control operation on the receiving layer. The receiving layer is preferably adjusted to a temperature below ambient temperature, especially cooled, especially to a temperature of less than 20° C., or of less than 1° C. or of less than 0° C. or of less than −10° C. or of less than −50° C. or of less than −60° C. In this case, the material of the receiving layer 140 undergoes a glass transition or/and crystallization as a result of the cooling. Preferably, the temperature of the receiving layer is controlled by means of liquid nitrogen, especially by means of nebulized nitrogen. Owing to the temperature control, especially owing to the glass transition, the receiving layer contracts, which generates mechanical stresses in the solid-state body 1. Owing to the mechanical stresses, a crack that connects the crack components 25, 27, 28, 29 is triggered, by which the solid-state component 12 is separated from the solid-state body 1.

FIG. 2*a* shows an embodiment in which the receiving layer 140 is disposed on a surface of the solid-state body that is spaced apart further from modifications than a surface 5 which is parallel or preferably essentially parallel or completely parallel thereto. The surface preferably has a further layer 145 (analogously to FIGS. 1*b*-1*f*). Components 150 or further material layers 150 are preferably disposed on the further layer 145 or on the exposed surface 5. Preferably, a stabilization layer and/or a protection layer 142 is disposed or generated on an exposed surface of the further material layer 150 or of the components 150. The components 150 here may be cast, for example, especially with a polymer material and/or ceramic material. It is additionally conceivable that a stabilization device, especially a further wafer, for example a glass wafer, is coupled, especially stuck or bonded, to the stabilization layer and/or protective layer 142. The effect of the stabilization layer and/or protective layer 142 or of the stabilization layer and/or protective layer 142 and the stabilization device here is that the components 150 or further material layer 150 are deformed only insignificantly, if at all, in the splitting operation or after the splitting operation. In the splitting operation, the deformation can be brought about by the forces generated by means of the receiving layer 140 and, after the splitting operation, deformation can be brought about by the remaining modifications, especially conversions of matter. The effect of the modifications in the case of a conversion of matter is to give rise to compression forces, which would result in warpage (bowing) of the solid-state layer removed without the stabilization layer/stabilization device.

A unit composed of removed solid-state layer and stabilization layer and/or protective layer 142 disposed thereon and of any stabilization device disposed thereon is then preferably subjected to further treatment for removal of stress. More preferably, the stabilization layer 142 or stabilization device forms a holding device by means of which the solid-state layer removed can be fixed for a material removal treatment with respect to a material removal device, especially a grinding and/or polishing device. By means of the material removal device, the modification components that remain on the solid-state layer removed are then removed, especially by material removal.

In the context of this invention, the solid-state layer is preferably always thinner than the remaining solid-state component. However, it is also conceivable that the receiving layer is disposed or generated not on a surface of the later solid-state layer but on a surface of the remaining solid-state component. When the solid-state material is silicon, the solid-state layer removed preferably has a height relative to the remaining solid-state body of less than 40% of the height of the remaining solid-state body, especially of less than 30% or 20% of the height of the remaining solid-state body. In the case of silicon, predetermined parameters are preferably envisaged for the generation of modifications: the numerical aperture is preferably between 0.5 and 0.8, especially 0.65, the penetration depth is between 150 μm and 1000 μm, especially 300 μm, the pulse separation is between 1 μm and 5 μm, especially 2 μm, the line spacing is between 1 μm and 5 μm, especially 2 μm, the pulse duration is between 50 ns and 400 ns, especially 300 ns, and the pulse energy is between 3 μJ and 30 μJ, especially 10 μJ.

If the material is SIC, the solid-state layer removed preferably has a height relative to the remaining solid-state body of less than 50% of the height of the remaining solid-state body, especially of less than 45% or 40% or 35% or 30% or 25% of the height of the remaining solid-state body. In the case of SIC, predetermined parameters are preferably envisaged for the generation of modifications: the numerical aperture is preferably between 0.4 and 0.8, especially 0.4, the penetration depth is preferably between 50 μm and 500 μm, especially 180 μm, the pulse separation is preferably between 0.1 μm and 3 μm, especially 1 μm, the line spacing is preferably between 10 μm and 100 μm, especially 75 μm, the pulse duration is preferably between 1 fs and 10 ns, especially 3 ns, and the pulse energy is preferably between 0.5 μJ and 30 μJ, especially 7 μJ.

In FIG. 2*b* as well, analogously to FIGS. 1*b*-1*f*, a further layer 145 may be generated, even if this has not been indicated. The further material layers or components 150 are therefore preferably generated or disposed on the further layer 145 or on an exposed surface of the solid-state body.

In addition, FIG. 2*b* shows that the receiving layer may be disposed on a surface of the remaining solid-state body and a further receiving layer 146 may be disposed on the components or further material layers 150. The components here may additionally have been provided with a stabilization layer 142, which means that the further receiving layer 146 has preferably been generated or disposed on the stabilization layer and/or protective layer 142. The further receiving layer 146 is preferably provided as a film and preferably likewise consists at least partly of a polymer material. More preferably, the further receiving layer 146 has the same material as the receiving layer 140 or 142. This embodiment is advantageous since the stresses for generating the crack can be introduced into the solid-state body from two sides.

FIGS. 3a to 3i show different arrangements that may be provided after the generation of the further material layers or components 150 to induce the crack.

FIGS. 3a-3i show various solid-state arrangements 176 as are advantageous for inducing crack progression stresses and/or crack triggering stresses.

Figure 9:
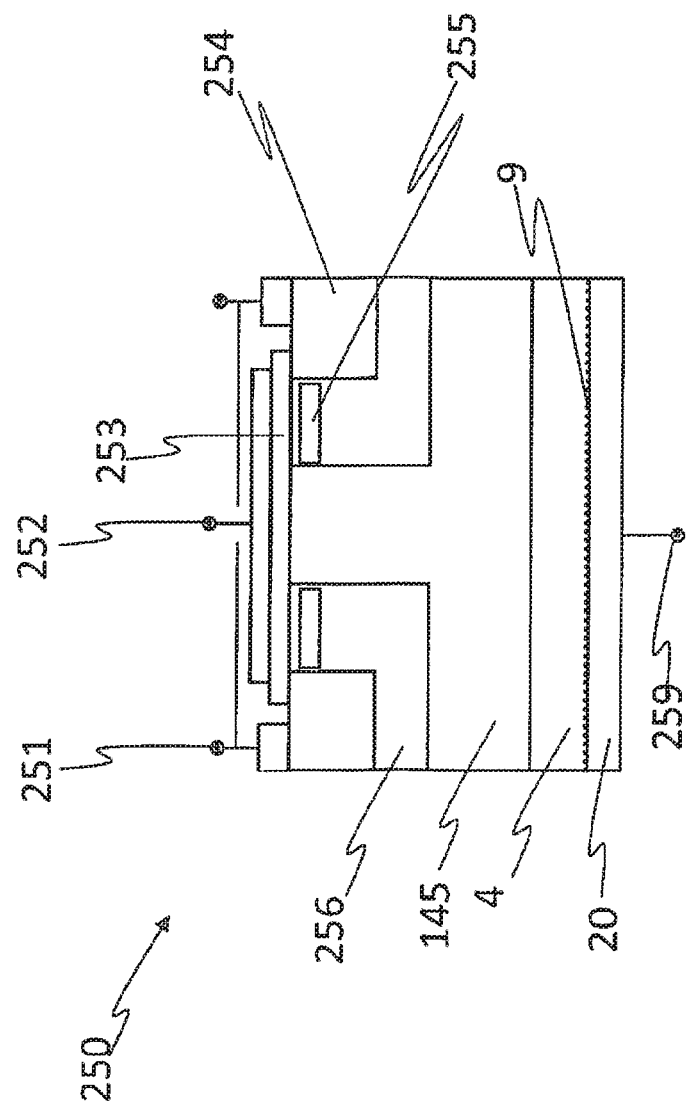

FIG. 3a here shows a processed solid-state body 1 or wafer with structures or components 150.

By comparison with the solid-state body 1 shown in FIG. 3a, there is a receiving layer 140 disposed or generated on the component side, especially on the components 150 or the further material layers 150, in the solid-state body 1 shown in FIG. 3b. The receiving layer 140 here is preferably disposed on the solid-state layer to be removed. The receiving layer 140 may also be identified as splitting film and has thus preferably been laminated onto the structure side. In the subsequent step, the entire arrangement is then cooled down, which brings about the split or crack triggering and/or crack progression.

By comparison with the diagram in FIG. 3b, according to FIG. 3c, a holding layer/bonded wafer is disposed on the underside of the solid-state body or on the exposed surface of the solid-state body. The holding layer may also be a tool carrier or chuck 3. In the subsequent step, the entire arrangement is then cooled down, which brings about the split or crack triggering and/or crack progression.

FIG. 3d, by comparison with FIG. 3b, shows an arrangement in which the solid-state body has been provided with receiving layers 140, 146 on both sides. The further receiving layer 146 is disposed here on a surface of the residual solid-state body that remains at a later stage, where an adhesion promotion layer 148 and/or sacrificial layer 149 and/or protective layer 142 may have been disposed or generated between the further receiving layer 146 and the solid-state body 1. The two receiving layers 140 and 146 have preferably been laminated on. In the subsequent step, the entire arrangement is then cooled down, which brings about the split or crack triggering and/or crack progression.

FIG. 3e shows an arrangement in which, by contrast with the arrangement known from FIG. 3d, no adhesion promotion layer 148 and/or sacrificial layer 149 and/or protective layer 142 has been disposed or generated between the further receiving layer 146 and the solid-state body 1. In the subsequent step, the entire arrangement is then cooled down, which brings about the split or crack triggering and/or crack progression.

FIG. 3f shows an arrangement constructed in an inverse manner from the arrangement known from FIG. 3d, meaning that the adhesion promotion layer 148 and/or sacrificial layer 149 and/or protective layer 142 has not been disposed or generated between the further receiving layer 146 and the solid-state body 1 but has/have been generated or disposed between the receiving layer 140 and the solid-state body 1 and hence on the solid-state layer to be removed. It is possible here to generate one or more layers, for example by means of spin-coating, on the components 150 or the structures. As a subsequent step, the entire arrangement is then cooled down, which brings about the split or crack triggering and/or crack progression.

FIG. 3g shows an arrangement or embodiment that corresponds to a combination of the arrangements of FIGS. 3d and 3f. The solid-state body has preferably been laminated with splitting film on both sides; it is likewise possible to provide a protective layer and/or adhesion promotion layer and/or sacrificial layer beneath the splitting film on either side; spin-coating, for example, on the structures is also possible. As a subsequent step, the entire arrangement is then cooled down, which brings about the split or crack triggering and/or crack progression.

FIG. 3h shows an arrangement similar to the arrangement shown in FIG. 3b, wherein the receiving layer has been disposed or laminated not onto a surface of the solid-state layer to be removed but onto one side of the residual solid-state body that remains after the removal. The removal is then effected as a result of the cooling analogously to the separation from an ingot or as in an ingot process.

FIG. 3i shows an arrangement which is similar to the arrangement known from FIG. 3c, wherein one or more of the layers or devices mentioned hereinafter are disposed or generated on the component side of the solid-state body or on or above the components 150. These layers or devices are preferably: at least or exactly one adhesion promotion layer 148 and/or at least or exactly one sacrificial layer 149 and/or at least or exactly one protective layer 142 and/or at least or exactly one stabilization device 3, especially a tool carrier or chuck or a further wafer. As a subsequent step, the entire arrangement is then cooled down, which brings about the split or crack triggering and/or crack progression.

FIG. 4 shows an illustration of an example for a writing pattern in X-Y processing:

Arrows 170, 172 represent the laser advance direction; the black circles represent the different laser shots or modifications 9 that do not overlap here with their damaging effect in the material. It is preferable here when the laser first moves in one direction and generates modifications 9 before turning round and writing modifications 9 in the second (lower) direction.

FIGS. 5a to 5d show different cooling devices 174. The solid-state arrangements 176 processed in these cooling devices 174 result from the various forms or executions of the solid-state bodies 1 provided with one or more receiving layers 140, 146 that are shown and described in FIGS. 1a to 3i. The cooling devices 174 shown herein all use a liquefied gas 178 as starting cooling medium for cooling. According to this embodiment, this starting cooling medium is either nebulized or evaporated. Preferably, the starting cooling medium is liquid nitrogen. Alternative cooling methods, for example by means of Peltier elements, are likewise conceivable and possible.

The cooling device 174 preferably serves to cool the receiving layer 140, 146 down to a temperature between −130° C. and −10° C., especially to a temperature between −80° C. and −50° C.

According to FIG. 5a, the cooling device 174 includes a nitrogen bath, wherein the receiving layer is positioned spaced apart, especially by means of an adjustable positioning device 180, from the liquid nitrogen held in the nitrogen bath. Thus, the solid-state arrangement is preferably disposed above a nitrogen bath on a positioning device or on a holder. The result is thus a temperature gradient over the chamber height, and that the temperature at the solid-state arrangement is adjustable over the fill height with the starting cooling medium or the position of the solid-state arrangement 176 (distance from the base of the chamber).

According to the embodiments of FIGS. 5*b* to 5*d*, the cooling device may preferably include a nebulizer, especially at least or exactly one perforated pipeline, for nebulization of liquid nitrogen or a nebulizer for nebulization of liquid nitrogen and the cooling effect may be generated by nebulized or evaporated nitrogen.

According to FIG. 5*b*, a homogeneous spray device/nebulizer is preferably provided for spraying or nebulization. The spraying or nebulizing is preferably effected above the solid-state arrangement 176. In addition, there are preferably temperature measurements for temperature monitoring that give output data for regulation of a valve, especially nitrogen valve. The temperature measurements are preferably made on the substrate or on the solid-state body 1, or on the receiving layer 140.

The substrate or the solid-state body 1 or the solid-state arrangement 176 preferably rests above the chamber base in order to stay clear of the settling of nitrogen at the base of the chamber.

According to FIG. 5*c*, a perforated pipeline is preferably used as homogeneous spray device. In addition, there are preferably temperature measurements for temperature monitoring that give output data for regulation of a valve, especially nitrogen valve. The temperature measurements are preferably made on the substrate or on the solid-state body 1, or on the receiving layer 140.

The substrate or the solid-state body 1 or the solid-state arrangement 176 preferably rests above the chamber base in order to stay clear of the settling of nitrogen at the base of the chamber.

According to FIG. 5*d* shows a cooling device 176 having a homogeneous spray device/nebulizer 182 for cooling of preferably multiple or each side. In addition, there are preferably temperature measurements for temperature monitoring that give output data for regulation of a valve, especially nitrogen valve. The temperature measurements are preferably made on the substrate or on the solid-state body 1, or on the receiving layer 140.

The substrate or the solid-state body 1 or the solid-state arrangement 176 preferably rests above the chamber base in order to stay clear of the settling of nitrogen at the base of the chamber.

The chamber 184 of the cooling device 174 is preferably closed in order to as far as possible prevent a temperature gradient by insulation.

FIG. 6 shows three examples of preferred relationships between the crystal lattice orientation and the generation of modifications. This method is useful especially for the separation of solid-state layers from a solid-state body consisting of SiC or including SIC. These relationships result in a further method of the invention. This further method of the invention preferably serves to separate at least one solid-state layer 4 from at least one solid-state body 1, especially a wafer from an ingot, or to thin a wafer. The further method of the invention preferably comprises at least the steps of: generating a multitude of modifications 9 by means of laser beams within the solid-state body 1 to form a detachment plane 8, and introducing an external force into the solid-state body 1 to generate stresses in the solid-state body 1, wherein the external force is sufficiently strong that the stresses result in crack propagation along the detachment plane 8.

According to the invention, the modifications are generated successively in at least one line or row, wherein the modifications 9 generated in a line or row are preferably generated at a separation X and with a height H in order that a crack that propagates between two successive modifications, especially a crack that propagates in crystal lattice direction, the direction of crack propagation of which is aligned at an angle W relative to the detachment plane, joins the two modifications together. The angle W here is preferably between 0° and 6°, especially 4°. Preferably, the crack propagates from a region below the center of a first modification toward a region above the center of a second modification. The essential relationship here is therefore that the size of the modification can/must be altered as a function of the separation of the modifications and the angle W.

Moreover, this method may also include the step of generating a composite structure by arrangement or generation of layers and/or components 150 atop or above an initially exposed surface 5 of the solid-state body 1, wherein the exposed surface 5 is preferably part of the solid-state layer 4 to be removed. More preferably, the modifications to form the detachment plane 8 are generated prior to the generation of the composite structure.

To introduce the external force, it is possible, for example, analogously to the above-described methods, to dispose a receiving layer 140 on an exposed surface 5 of the composite structure or solid-state body.

The three FIGS. 6*a* to 6*c* are supposed to illustrate how the size of the damage/modification zone amorphized/phase-transformed by laser affects the height covered by the sawtooth pattern of the crack. In general, the crack runs along the crystal planes, i.e. between individual atoms of the crystal. These clear planes no longer exist in the modified zone, which thus comes to a halt.

By means of a numerical aperture which is preferably as high as possible, the size of the damage zone can be reduced in beam direction, and also laterally in the focal plane. Since it is necessary to attain only the threshold intensity, a smaller pulse energy is then also sufficient here.

If the damage zone is then made smaller in a suitable manner, the laser modifications can be increased in density, which allows the sawtooth to be shorter, resulting overall in a smaller vertical extent of the modified plane (first image).

If the damage zone, by contrast, is made larger (higher energy and/or lower numerical aperture—FIG. 6*b*), the elevated pressure in the amorphized zone also triggers a larger microcrack, which can be controlled (i.e, stopped in a controlled manner) with enablement of a damage zone of greater extent at a greater distance.

Finally, FIG. 6*c* shows the risk that if the damage zone is not sufficiently large and cracks that run too far are triggered by the laser modification, the cracks firstly run too far—i.e. the difference in height that results from the cracks becomes greater than desired—and the cracks are secondly driven below the further damage zones and not stopped by the amorphized material. This then leads again to material losses since all the material layers that have been incised have to be removed for the end product or another laser processing operation.

FIG. 7 shows a schematic of a snapshot from a further method of the invention. This further method preferably serves to separate at least one solid-state layer 4 from at least one solid-state body 1, especially a wafer from an ingot, or to thin a wafer. The further method of the invention preferably comprises at least the steps of: generating a multitude of modifications 9 by means of laser beams within the solid-state body 1 to form a detachment plane 8, and introducing an external force into the solid-state body 1 to generate stresses in the solid-state body 1, wherein the external force is sufficiently strong that the stresses result in crack propagation along the detachment plane 8.

According to the invention, in a first step, the modifications are generated on a line 103 and preferably at the same distance from one another. It is additionally conceivable that a multitude of these lines generated in the first step is generated. These first lines are more preferably generated parallel to the direction of crack propagation and preferably in a straight line or in the form of a circular arc, especially in the same plane. After the generation of these first lines, second lines 105 are preferably generated for triggering and/or driving preferably subcritical cracks. These second lines are preferably likewise generated in a straight line. More preferably, the second lines are inclined relative to the first lines, especially orthogonally aligned. The second lines preferably extend in the same plane as the first lines or more preferably in a plane parallel to the plane in which the first lines extend. Subsequently, third lines are preferably generated to connect the subcritical cracks.

This method is useful especially for the separation of solid-state layers from a solid-state body consisting of SiC or including SiC.

In addition, the modifications may be generated successively in at least one line or row, wherein the modifications 9 generated in a line or row are preferably generated at a separation X and with a height H in order that a crack that propagates between two successive modifications, especially a crack that propagates in crystal lattice direction, the direction of crack propagation of which is aligned at an angle W relative to the detachment plane joins the two modifications together. The angle W here is preferably between 0° and 6°, especially 4°. Preferably, the crack propagates from a region below the center of a first modification toward a region above the center of a second modification. The essential relationship here is therefore that the size of the modification can/must be altered as a function of the separation of the modifications and the angle W.

Moreover, this method may also include the step of generating a composite structure by arrangement or generation of layers and/or components 150 atop or above an initially exposed surface 5 of the solid-state body 1, wherein the exposed surface 5 is preferably part of the solid-state layer 4 to be removed. More preferably, the modifications to form the detachment plane 8 are generated prior to the generation of the composite structure.

To introduce the external force, it is possible, for example, analogously to the above-described methods, to dispose a receiving layer 140 on an exposed surface 5 of the composite structure or solid-state body.

Thus, in the further laser method of the invention, lines are preferably generated parallel to the direction of crack propagation (preferably called transverse lines) on SiC (but also other materials), in order first to define a plane for the preferred crack triggering (crack initialization) before longitudinal lines drive the cracks. The cracks here are initialized first in the transverse direction, then in the longitudinal direction, before a final step makes lines between the longitudinal lines from the second step in order to fully trigger the cracks. This enables shorter crack pathways, which minimizes the final surface roughness.

Example image for transverse lines (with the sawtooth) and crack triggering lines (on the wave crests of the sawtooth).

FIG. 8 shows, by way of example, a Schottky diode 200. This diode 200 preferably includes a solid-state layer 4 that in turn includes components modified by means of laser radiation, especially modifications 9. The modifications 9 here have been generated in the vicinity of a first surface of the solid-state layer 4. A metal layer 20 has preferably been generated on this first surface of the solid-state layer 4, especially by means of sputtering or chemical deposition. The solid-state layer 4 has a second surface which is opposite the first surface and on which a further layer 145 has been generated, especially by means of an epitaxy method. The solid-state layer 4 preferably consists of highly doped SiC or includes highly doped SiC, and the layer 145 generated preferably consists of lightly doped SiC or includes lightly doped SiC. Lightly doped here means preferably a lower level of doping than highly doped. Thus, the layer 145 generated preferably has less doping per unit volume than the solid-state layer 4. Reference numeral 150 indicates a Schottky contact.

FIG. 9 shows, by way of example, the structure of a MOSFET 250. This MOSFET 250 preferably includes a solid-state layer 4 that in turn includes components modified by means of laser radiation, especially modifications 9. The modifications 9 here have been generated in the vicinity of a first surface of the solid-state layer 4. A metal layer 20 has preferably been generated on this first surface of the solid-state layer 4, especially by means of sputtering or chemical deposition. The metal layer 20 preferably forms a drain (high) via a terminal 259. The solid-state layer 4 has a second surface opposite the first surface. A further layer, especially n-type SiC, has been formed, especially generated or disposed, on the second surface. Reference numeral 256 indicates a further material or element, especially p-type SiC. Reference numeral 254 represents n+. Reference numeral 255 preferably indicates one or more channels, especially for conducting current. The layer identified by reference numeral 253 preferably consists of or includes SiO2. Reference numeral 251 indicates a source (low), and reference numeral 252 indicates a gate.

The present invention may thus relate to a method of providing at least one solid-state layer 4, wherein the solid-state layer 4 is separated from a solid-state body 1. The method of the invention preferably comprises the following steps:

generating a multitude of modifications 9 by means of laser beams within the solid-state body 1 to form a detachment plane 8, wherein the modifications 9 generate compressive stresses in the solid-state body 1, removing the solid-state layer 4 by a separation of the remaining solid-state body 1 and the solid-state layer 4 along the detachment plane 8 formed by the modifications 9, wherein at least constituents of the modifications 9 that generate the compressive stresses remain on the solid-state layer 4, wherein so many modifications 9 are generated that the solid-state layer 4 becomes detached from the solid-state body 1 owing to the modifications 9, or wherein an external force is introduced into the solid-state body 1 to generate further stresses in the solid-state body 1, wherein the external force is sufficiently strong that the stresses bring about crack propagation along the detachment plane 8 formed by the modifications, generating a metal layer on the surface exposed by the separation of the solid-state layer 4 from the solid-state body 1 for at least partial and preferably substantial and more preferably complete compensation for a deformation of the solid-state layer 4 brought about by the compressive stresses of the remaining modification constituents or for at least partial and preferably substantial or complete compensation for the compressive stresses.

Alternatively, the present invention may relate to a method of generating electrical components. This method preferably comprises the steps of generating a multitude of modifications 9 by means of laser beams within a solid-state body 1 to form a detachment plane 8, wherein the modifications 9 generate compressive stresses in the solid-state body 1, generating a composite structure by disposing or generating layers and/or components 150 on or above an initially exposed surface 5 of the solid-state body 1, wherein the exposed surface 5 is part of the solid-state layer 4 to be removed, removing the solid-state layer 4 by a separation of the remaining solid-state body 1 and the solid-state layer 4 along the detachment plane 8 formed by the modifications 9, wherein at least constituents of the modifications 9 that generate the compressive stresses remain on the solid-state layer 4, wherein so many modifications 9 are generated that the solid-state layer 4 becomes detached from the solid-state body 1 owing to the modifications 9, or wherein an external force is introduced into the solid-state body 1 to generate further stresses in the solid-state body 1, wherein the external force is sufficiently strong that the stresses bring about crack propagation along the detachment plane 8 formed by the modifications, generating a metal layer 20 on the surface exposed by the separation of the solid-state layer 4 from the solid-state body 1 for at least partial compensation for the compressive stresses brought about by the modification constituents.

The invention claimed is:

1. A method of separating a solid-state layer from a solid-state body, the method comprising:
   generating a plurality of modifications, by laser beams, within the solid-state body to form a detachment plane, with generation of compressive stresses in the solid-state body caused by the modifications;
   separating the solid-state layer from the solid-state body along the detachment plane, leaving at least constituents of the modifications that generate compressive stresses on the solid-state layer, wherein the solid-state layer becomes detached from the solid-state body owing to the modifications and/or an external force is introduced into the solid-state body for generating further stresses in the solid-state body that bring about crack propagation along the detachment plane formed by the modifications;
   producing a metal layer on a surface exposed by the separation of the solid-state layer from the solid-state body for at least partial compensation for a deformation of the solid-state layer brought about by the compressive stresses of the remaining modification constituents, or for at least partial compensation for the compressive stresses;
   prior to the generation of the detachment plane, treating the solid-state body by at least one high-temperature method that is executed at a temperature between 70° C. and the melting temperature or evaporation temperature of a material of the solid-state body,
   wherein the at least one high-temperature method is an epitaxial method, a doping method or a method using plasma,
   wherein the high-temperature method produces at least one layer on the solid-state body and having predefined parameters,
   wherein at least one of the predefined parameters defines a maximum degree of refraction and/or absorption and/or reflection of laser light waves, and
   wherein the degree of refraction and/or absorption and/or reflection is below 5%.

2. The method of claim 1, wherein the metal layer is produced on the solid-state layer in a first state of matter and at a temperature above room temperature, and is in a second state of matter at room temperature, wherein, as a result of a transition from the first state to the second state, the metal layer subjects the solid-state layer to at least partial compensation of the deformation brought about by the compressive stresses on the remaining modification constituents.

3. The method of claim 1, wherein the metal layer is produced on the solid-state layer within a temperature range of at least 100° C. above room temperature and up to a maximum of 2000° C. or less than the melting or evaporation temperature of the solid-state material, and wherein a cooling of the metal layer to room temperature subjects the solid-state layer to at least partial compensation for the deformation brought about by the compressive stresses on the remaining modification constituents.

4. The method of claim 1, wherein the metal layer is generated by sputtering or electrochemical deposition.

5. The method of claim 1, wherein the solid-state body comprises silicon carbide (SiC), and wherein the solid-state layer is separated from the solid-state body with a thickness of less than 200 μm.

6. The method of claim 1, wherein the external force is introduced via arrangement of an absorbing layer on an exposed surface of the solid-state body or of the solid-state layer to be removed, wherein the absorbing layer includes a polymer material and the absorbing layer is thermally stressed so as to generate stresses in the solid-state body, wherein the thermal stress is brought about by cooling of the absorbing layer to a temperature below ambient such that the polymer material of the absorbing layer undergoes a glass transition, and wherein the stresses result in propagation of a crack in the solid-state body along the detachment plane that separates the solid-state layer from the solid-state body.

7. The method of claim 6, further comprising:
   arranging a stabilization layer, for bounding deformations of an exposed layer or of exposed components, on the exposed surface, the exposed layer or the exposed components, the deformations resulting from the mechanical stresses induced by the absorbing layer,
   wherein the stabilization layer comprises a ceramic material and/or a polymer material.

8. The method of claim 1, wherein the modifications are generated by multiphoton excitation, wherein a plurality of base modifications is first generated on a line that runs homogeneously at least in sections, wherein the base modifications are generated with predefined process parameters that include energy per shot and/or shot density, wherein at least one value of the process parameters are fixed as a function of crystal lattice stability of the solid-state body such that the crystal lattice around the respective base modifications remains intact, wherein trigger modifications for triggering of subcritical cracks are also generated, wherein at least one process parameter for generating the trigger modifications is different than the at least one process parameter for generating the base modifications and/or the trigger modifications are generated in a direction inclined or spaced apart relative to a direction of the line along which the base modifications generated run, and wherein the subcritical cracks propagate by less than 5 mm.

9. The method of claim 8, wherein the subcritical cracks propagate between 5 μm and 200 μm in the solid-state body and/or in crack sections between the regions of multiple lines in which the subcritical cracks have propagated owing to the stresses that are generated by the glass transition.

10. A method of producing electrical components, the method comprising:
    generating a plurality of modifications, by laser beams, within a solid-state body to form a detachment plane, with generation of compressive stresses in the solid-state body caused by the modifications;

generating a composite structure by arranging or producing layers and/or components on or above an initially exposed surface of the solid-state body, the exposed surface being part of a solid-state layer to be removed;

separating the solid-state layer from the solid-state body along the detachment plane formed by the modifications, leaving at least constituents of the modifications that generate compressive stresses on the solid-state layer, wherein the solid-state layer becomes detached from the solid-state body owing to the modifications and/or an external force is introduced into the solid-state body for generating further stresses in the solid-state body that bring about crack propagation along the detachment plane formed by the modifications;

producing a metal layer on a surface exposed by the separation of the solid-state layer from the solid-state body, for at least partial compensation for the compressive stresses brought about by the modification constituents;

prior to the generation of the detachment plane, treating the solid-state body by at least one high-temperature method that is executed at a temperature between 70° C. and the melting temperature or evaporation temperature of a material of the solid-state body, wherein the at least one high-temperature method is an epitaxial method, a doping method or a method using plasma, wherein the high-temperature method produces at least one layer on the solid-state body and having predefined parameters, wherein at least one of the predefined parameters defines a maximum degree of refraction and/or absorption and/or reflection of laser light waves, and wherein the degree of refraction and/or absorption and/or reflection is below 5%.

11. The method of claim 10, wherein the electrical components are vertical components, and wherein the metal layer forms an electrical contact and/or forms an interface for removal of heat.

12. The method of claim 10, wherein the electrical components are horizontal components, and wherein the metal layer forms an interface for removal of heat.

13. The method of claim 10, wherein at least 10 or at least 50 or at least 100 electrical components are produced on average per cm$^2$ of a flat surface side of the solid-state layer, and wherein the electrical components are separated from one another by dicing after production thereof.

14. The method of claim 10, wherein the metal layer is produced on the solid-state layer in a first state of matter and at a temperature above room temperature, and is in a second state of matter at room temperature, wherein, as a result of a transition from the first state to the second state, the metal layer subjects the solid-state layer to at least partial compensation of the deformation brought about by the compressive stresses on the remaining modification constituents.

15. The method of claim 10, wherein the metal layer is produced on the solid-state layer within a temperature range of at least 100° C. above room temperature and up to a maximum of 2000° C. or less than the melting or evaporation temperature of the solid-state material, and wherein a cooling of the metal layer to room temperature subjects the solid-state layer to at least partial compensation for the deformation brought about by the compressive stresses on the remaining modification constituents.

16. The method of claim 10, wherein the external force is introduced via arrangement of an absorbing layer on an exposed surface of the solid-state body or of the solid-state layer to be removed, wherein the absorbing layer includes a polymer material and the absorbing layer is thermally stressed so as to generate stresses in the solid-state body, wherein the thermal stress is brought about by cooling of the absorbing layer to a temperature below ambient such that the polymer material of the absorbing layer undergoes a glass transition, and wherein the stresses result in propagation of a crack in the solid-state body along the detachment plane that separates the solid-state layer from the solid-state body.

17. The method of claim 16, further comprising:
arranging a stabilization layer, for bounding deformations of an exposed layer or of exposed components, on the exposed surface, the exposed layer or the exposed components, the deformations resulting from the mechanical stresses induced by the absorbing layer,
wherein the stabilization layer comprises a ceramic material and/or a polymer material.

18. The method of claim 10, wherein the modifications are generated by multiphoton excitation, wherein a plurality of base modifications is first generated on a line that runs homogeneously at least in sections, wherein the base modifications are generated with predefined process parameters that include energy per shot and/or shot density, wherein at least one value of the process parameters are fixed as a function of crystal lattice stability of the solid-state body such that the crystal lattice around the respective base modifications remains intact, wherein trigger modifications for triggering of subcritical cracks are also generated, wherein at least one process parameter for generating the trigger modifications is different than the at least one process parameter for generating the base modifications and/or the trigger modifications are generated in a direction inclined or spaced apart relative to a direction of the line along which the base modifications generated run, and wherein the subcritical cracks propagate by less than 5 mm.

19. The method of claim 18, wherein the subcritical cracks propagate between 5 µm and 200 µm in the solid-state body and/or in crack sections between the regions of multiple lines in which the subcritical cracks have propagated owing to the stresses that are generated by the glass transition.

* * * * *